(12) United States Patent
Koike et al.

(10) Patent No.: US 11,515,810 B2
(45) Date of Patent: Nov. 29, 2022

(54) ENERGY CONVERSION FILM AND ENERGY CONVERSION ELEMENT USING SAME

(71) Applicant: YUPO CORPORATION, Tokyo (JP)

(72) Inventors: Hiroshi Koike, Ibaraki (JP); Yutaro Sugamata, Ibaraki (JP); Seiichiro Iida, Ibaraki (JP)

(73) Assignee: YUPO CORPORATION, Tokyo (JP)

( * ) Notice: Subject to any disclaimer, the term of this patent is extended or adjusted under 35 U.S.C. 154(b) by 698 days.

(21) Appl. No.: 16/481,983

(22) PCT Filed: Jan. 31, 2018

(86) PCT No.: PCT/JP2018/003271
§ 371 (c)(1),
(2) Date: Jul. 30, 2019

(87) PCT Pub. No.: WO2018/143294
PCT Pub. Date: Aug. 9, 2018

(65) Prior Publication Data
US 2019/0393806 A1   Dec. 26, 2019

(30) Foreign Application Priority Data
Feb. 1, 2017   (JP) .............................. JP2017-017081

(51) Int. Cl.
*H02N 1/08*       (2006.01)
*H01L 41/047*    (2006.01)
(Continued)

(52) U.S. Cl.
CPC ............. *H02N 1/08* (2013.01); *H01L 41/047* (2013.01); *H01L 41/113* (2013.01);
(Continued)

(58) Field of Classification Search
None
See application file for complete search history.

(56) References Cited

U.S. PATENT DOCUMENTS 4,654,546 A    3/1987  Kirjavainen
4,789,504 A *  12/1988 Ohmori .................. H01G 7/023
                                                                96/99
(Continued)

FOREIGN PATENT DOCUMENTS

CN       204011486 U       12/2014
EP       2509126 A1 *      10/2012      ............. C08G 18/10
(Continued)

OTHER PUBLICATIONS

Office Action issued in Japanese Patent Application No. 2018-565619 dated Feb. 25, 2020, English Translation.
(Continued)

*Primary Examiner* — Evren Seven
(74) *Attorney, Agent, or Firm* — Greenblum & Bernstein, P.L.C.

(57) ABSTRACT

Provided is an energy conversion film excellent in charge retention performance and suppressed in deterioration of piezoelectricity even if it is exposed to a high temperature environment and an energy conversion element and the like using the film. An energy conversion element comprising: an energy conversion film at least comprises a charged resin film consisting of a resin film at least containing a thermoplastic resin and a metal soap; and an electrode provided on at least one of the two surfaces of the energy conversion film.

17 Claims, 1 Drawing Sheet

(51) Int. Cl.
　　　*H01L 41/113*　　(2006.01)
　　　*H01L 41/18*　　(2006.01)
　　　*H01L 41/193*　　(2006.01)
　　　*H01L 41/253*　　(2013.01)
(52) U.S. Cl.
　　　CPC .......... *H01L 41/183* (2013.01); *H01L 41/193* (2013.01); *H01L 41/253* (2013.01)

(56) References Cited

U.S. PATENT DOCUMENTS

| | | |
|---|---|---|
| 2007/0235903 A1 | 10/2007 | Chin et al. |
| 2012/0177907 A1 | 7/2012 | Koike et al. |

FOREIGN PATENT DOCUMENTS

| | | |
|---|---|---|
| JP | 60-196922 A | 10/1985 |
| JP | 61-148044 A | 7/1986 |
| JP | 62-61311 A | 3/1987 |
| JP | 2008-221074 A | 9/2008 |
| JP | 2011-084735 A | 4/2011 |
| JP | 2011-086924 A | 4/2011 |
| JP | 2014-074104 A | 4/2014 |
| JP | 2016-039275 A | 3/2016 |
| WO | WO-2010143687 A1 * | 12/2010 ............. H01L 37/02 |

OTHER PUBLICATIONS

Office Action (Decision of Rejection) issued in CN Patent Application No. 201880008235.1, dated Aug. 31, 2021, English translation.

International Search Report and Written Opinion issued in International Patent Application No. PCT/JP2018/003271, dated Apr. 24, 2018; and English-langauge translations thereof.

International Preliminary Report on Patentability for in International Patent Application No. PCT/JP2018/003271, dated Aug. 6, 2019, and English-language translation thereof.

CN Office Action issued in CN Patent Application No. 201880008235.1 dated Oct. 30, 2020, English Translation.

EESR issued in EP Patent Application No. 18747414.3 dated Nov. 4, 2020.

CN Office Action issued in CN Patent Application No. 201880008235.1 dated Jun. 7, 2020, English Translation.

* cited by examiner

ENERGY CONVERSION FILM AND ENERGY CONVERSION ELEMENT USING SAME

TECHNICAL FIELD

The present invention relates to an energy conversion film for use in electrical-mechanical energy conversion for converting mechanical energy such as vibration and a pressure change into electric energy, electrical-thermal energy conversion for converting thermal energy such as infrared ray and a temperature change into electric energy, and machine-thermal energy conversion for converting mechanical energy to thermal energy; and an energy conversion element using the energy conversion film. The energy conversion film of the present invention is an electret excellent in heat resistance and excellent in electric-mechanical energy conversion performance.

BACKGROUND ART

The electret is a material semi-permanently keeping an electro polarization therein, even if an electric field is not present outside, creates an electric field (providing electric power) to the outside, and refers to a material obtained by subjecting a material such as, e.g., a polymer material or an inorganic material rarely conducting electricity, to a thermal/electrically treatment, thereby semi-permanently polarizing a part of the material (macroscopically a material charged with static electricity or a material retaining charge).

Conventionally, an electret formed of a polymer material has been used in various forms such as film, sheet, fiber, woven fabric, and nonwoven fabric, depending on the uses. Particularly, an electret filter obtained by molding the electret formed of a polymer material has been widely employed in application such as an air filter, which efficiently absorbs minute dust and allergens with the help of an electric field. The electret formed of a polymer material has been more widely used as materials for electrical-mechanical energy conversion devices such as speakers, headphones, microphones, ultrasonic sensors, pressure sensors, acceleration sensors, and vibration control devices.

An electret using a porous resin film is known to exert a piezoelectric effect and can be used for detecting a sound, producing a sound, measuring vibration, and controlling vibration. For example, a foamed film, which is obtained by extruding foamable thermoplastic resin in the form of film, simultaneously with foaming the resin to obtain a porous film having a large number of pores, and subsequently two-dimensionally stretching the porous film, has been proposed (Patent Literature 1).

However, such a foamed film shrinks with time or under reduced pressure, because a gas gradually releases from pores within the film. Because of this, it is difficult to constantly keep pore shape, foam ratio, and porosity. Then, Patent Literature 1 discloses a method for fixing a shape by applying a heat treatment to a foamable film present during the stage of expansion to thereby accelerate a crystallization of thermoplastic resin. However, if the heat treatment is applied at a temperature higher than the phase transition temperature or glass transition temperature of thermoplastic resin, the gas permeability of the thermoplastic resin increases, with the result that a gas is easily released from the pores within the film and piezoelectricity thereof disadvantageously deteriorates.

In contrast, the present inventors proposes, as a piezoelectric material having a high energy conversion performance, an energy conversion film having pores constant in size produced by using thermoplastic resin and an inorganic fine powder or organic filler having a predetermined volume average particle diameter (Patent Literature 2, Patent Literature 3).

However, if these conventional energy conversion films are used under a high temperature environment such as an automobile engine room, there is a possibility that the conversion films are exposed to a higher temperature than the phase transition temperature or the glass transition temperature of the thermoplastic resin to be used in the energy conversion films. If the conventional energy conversion films are stored and used for a long time under the high temperature environment, charge retention performance and piezoelectricity disadvantageously deteriorate.

In contrast, an electret sheet using a positively chargeable charge control agent, such as a specific azine derivative or a quaternary ammonium salt compound, and a negatively chargeable charge control agent such as a metal salt of a specific salicylic acid derivative or an azochrome compound, in combination, is disclosed (Patent Literature 4). According to the electret sheet of Patent Literature 4, excellent piezoelectricity even under high temperature conditions can be maintained by adding the aforementioned charge control agent in a resin film, as an additive.

CITATION LIST

Patent Literatures

Patent Literature 1: Japanese Patent Laid-Open No. 61-148044

Patent Literature 2: Japanese Patent Laid-Open No. 2011-084735

Patent Literature 3: Japanese Patent Laid-Open No. 2011-086924

Patent Literature 4: Japanese Patent Laid-Open No. 2014-074104

SUMMARY OF INVENTION

Technical Problem

The present inventors applied the technique disclosed in Patent Literature 4 to an energy conversion film and an energy conversion element and conducted studies. However, it was found that the charge control agent described in Patent Literature 4 is insufficient in heat resistance, and that the piezoelectricity of the energy conversion film and energy conversion element using the charge control agent under a high temperature environment is still insufficient. Accordingly, to enhance the piezoelectricity under a high temperature environment, an agent for augmenting chargeability having heat resistance is required as an additive for use in the energy conversion film.

The present invention was made in the circumstance of the aforementioned background art. An object of the present invention is to provide an energy conversion film excellent in charge retention performance and suppressed in deterioration of piezoelectricity even if it is exposed to a high temperature environment, and an energy conversion element and the like using the film.

Note that, other than the object mentioned above, a functional effect induced by constitutions descried in embodiments for carrying out the invention (described later)

as long as the functional effect cannot be obtained by conventional techniques, can be positioned as another object of the present invention.

Solution to Problem

The present inventors conducted intensive studies with a view to solving the above problems. As a result, they found that a predetermined energy conversion film is excellent in charge retention performance even if it is exposed to a high temperature environment, and that an energy conversion element using the film is suppressed in deterioration of piezoelectricity. Based on the findings, the present invention was accomplished.

More specifically, the present invention-provides the following specific embodiments.

[1] An energy conversion element comprising: an energy conversion film at least comprising a charged resin film consisting of a resin film at least containing a thermoplastic resin and a metal soap; and an electrode provided on at least one of two surfaces of the energy conversion film.

[2] The energy conversion element according to [1], wherein the thermoplastic resin contains a polyolefin resin, and the metal soap has a melting point of 50° C. to 220° C.

[3] The energy conversion element according to [1] or [2], wherein the metal soap is a salt of a fatty acid having 5 to 30 carbon atoms and a metal.

[4] The energy conversion element according to any one of [1] to [3], wherein the metal soap is a salt of a fatty acid and a metal belonging to group 2 to 13 of the periodic table.

[5] The energy conversion element according to [3] or [4], wherein the metal is at least one selected from the group consisting of zinc, calcium, and aluminum.

[6] The energy conversion element according to any one of [1] to [5], wherein the resin film is a porous resin film having pores within the film.

[7] The energy conversion element according to any one of [1] to [6], wherein the energy conversion film at least comprises a charged resin film obtained by injecting a charge into the resin film by DC corona discharge processing.

[8] The energy conversion element according to any one of [1] to [7], wherein the electrode has a surface resistivity of $1 \times 10^{-3} \Omega/\square$ to $9 \times 10^{7} \Omega/\square$.

[9] The energy conversion element according to any one of [1] to [8], wherein a maximum voltage, which is generated by an impact when an iron ball having a diameter of 9.5 mm and a mass of 3.5 g is naturally dropped from a height of 8 mm in the vertical direction on the energy conversion element, which has been subjected to a heat treatment at 85° C. for 14 days and placed on a horizontal plane at a temperature of 23° C. in an environment of a relative humidity of 50%, is 5 mV or more.

[10] An energy conversion film at least comprising a charged resin film consisting of a resin film at least containing a thermoplastic resin and a metal soap. It is preferable that the energy conversion film further comprises at least one of the technical features according to [2] to [9] mentioned above.

Advantageous Effects of Invention

The energy conversion film of the present invention and the energy conversion element using the film are enhanced in charge retention performance by the presence of a metal soap contained in the film and low in deterioration of piezoelectricity even if they are exposed to a high temperature environment. Because of this, the film and element are particularly useful as module members that can be used and stored under high temperature environments, such as a speaker, a headphone, an ultrasonic transducer, an ultrasonic motor, a vibration control device, a microphone, an ultrasonic sensor, a pressure sensor, an acceleration sensor, a distortion sensor, a fatigue/crack sensor, a medical sensor, a measuring instrument, a control device, an abnormality diagnosis system, a security device, a stabilizer, a robot, a percussion instrument, a game machine, and a generator.

DESCRIPTION OF EMBODIMENTS

Figure 1:
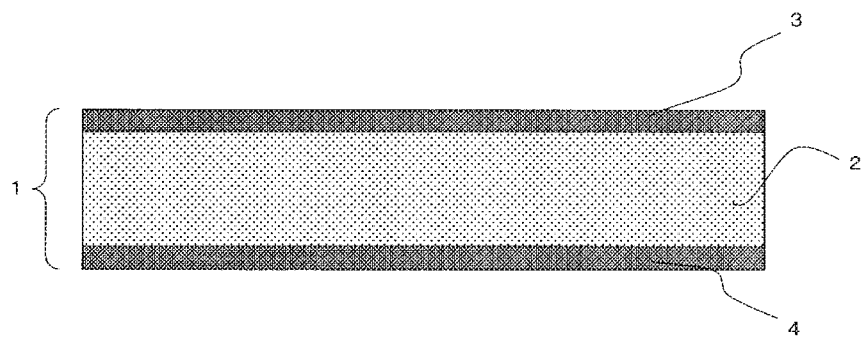
FIG. 1 is a schematic sectional view of an embodiment of the energy conversion film 1 of the present invention.

Now, embodiments of the present invention will be described with reference to the accompany drawings. Note that, the following embodiments are just examples for explaining the present invention and the present invention is not limited to the embodiments alone. In the following, unless otherwise specified, positional relationship, such as up, down, left, and right, are based on the positional relationship shown in the drawings. The dimensional ratios of the drawings are not limited to those shown in the drawings. Note that, in the specification, for example, the numeric range of "1 to 100" described herein includes both the lower limit "1" and the upper limit "100". The same applies to other numeric ranges described herein.

An energy conversion film of the present invention at least has a charged resin film consisting of a resin film at least containing thermoplastic resin and a metal soap. The charged resin film herein refers to a resin film to which charge is injected. More specifically, the energy conversion film and charged resin film according to the present invention are each the resin film "charged", i.e., the resin film purposely charged, and thus, they have a large amount of charge compared to the resin film. An energy conversion element of the present invention is prepared by providing an electrode on at least one of the two surfaces of the energy conversion film. Now, individual members constituting the energy conversion film of the present invention and the energy conversion element using the film and methods for producing them will be more specifically described.

Figure 2:
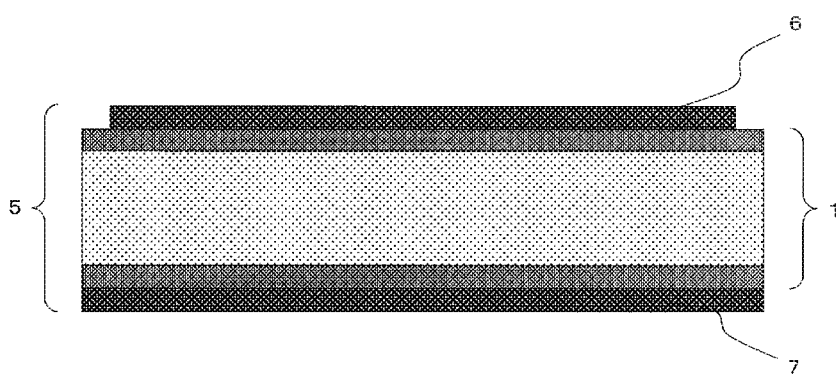
FIG. 2 is a schematic sectional view of an embodiment of the energy conversion element 5 of the present invention.

FIG. 1 and FIG. 2 show preferred embodiments of the energy conversion film of the present invention and the energy conversion element thereof, respectively. An energy conversion film 1 has a charged resin film prepared by injecting a charge to a resin film 2 (core layer) at least containing a thermoplastic resin and a metal soap, and optional skin layers 3, 4 (resin films at least containing a thermoplastic resin) respectively on both upper and lower surfaces of the resin film 2. The energy conversion element 5 is constituted by providing an electrode (6, 7) to at least one of the two surfaces of the energy conversion film 1.

[Energy Conversion Film]

The energy conversion film of the present invention (charged resin film) can be obtained by injecting a charge into a resin film containing thermoplastic resin and a metal soap. The resin film herein to which charge is to be injected is preferably a porous resin film having a large number of pores within the film (hereinafter also referred to as "inner pores").

Note that, the energy conversion film of the present invention (not charged) before electretization (described later) is referred to herein as a "resin film" or a "porous resin film"; whereas, the energy conversion film (charged) after the electretization is referred to as a "energy conversion film", "charged resin film", or "charged porous resin film". In the energy conversion film of the present invention, the electrical-mechanical energy conversion performance includes not only an ability to convert mechanical energy (motion energy) to electric energy but also an ability to convert electric energy to mechanical energy (motion energy).

[Resin Film]

The resin film is formed by molding a resin composition at least containing a thermoplastic resin (described later) and a metal soap (described later) into a thin film by a molding method (described later). The resin film is preferably a porous resin film having a large number of pores within the film. Also, the resin film is preferably a multilayer resin film (laminated resin film) containing a core layer and a skin layer.

In order to improve adhesion to the electrode to be provided for constituting an energy conversion element, a surface treatment (described later) may be applied to a surface of a resin film or an anchor coat layer may be provided on the surface of the resin film. If the anchor coat layer is provided, the energy conversion element has a laminate structure of an energy conversion film/anchor coat layer/electrode.

[Porous Resin Film]

The porous resin film is formed by molding a resin composition at least containing a thermoplastic resin and a metal soap, and preferably further containing a pore-forming nucleating agent (described later) into a thin film in accordance with a molding method (described later), and has a large number of pores formed within the film.

The porous resin film is preferably a multilayer resin film having a core layer and a skin layer; more preferably a multilayer resin film having a core layer consisting of a stretched resin film having pores within the layer and a skin layer consisting of a stretched resin film on at least one of the two surfaces of the core layer; and further preferably a multilayer resin film having a core layer consisting of a stretched resin film having pores within the layer and skin layers consisting of a stretched resin film respectively on the two surfaces of the core layer. The porous resin film may be obtained by penetrating an unreactive gas into a resin film under application of pressure, releasing the gas in an unpressurized condition to form pores at an appropriate porosity by gas foaming, and subsequently applying a heat treatment under an unpressurized condition to fix the pores.

When the porous resin film contains a stretched resin film having pores within the film, like the core layer, the stretched resin film preferably has inner pores which are formed by stretching a thermoplastic resin sheet at least containing a thermoplastic resin, a metal soap, and a pore-forming nucleating agent at a temperature of not more than the melting point of the thermoplastic resin.

In the porous resin film, pores having a shape suitable not only for accumulating charge within the film but also for bringing about high recovery of the porous resin film from compression, can be formed.

The shape and size of pores in the porous resin film may be appropriately determined depending on, e.g., requisite performances and are not particularly limited. Note that, in the energy conversion film, each of the pores within the porous resin film is considered to have a pair of different charges, which are present respectively on the inner surfaces facing with each other, like a capacitor. Because of this, in order to accumulate charge within the pores, the pores of the porous resin film are required to have not less than a predetermined area and height, similarly to a single-plate capacitor. If not less than a predetermined area is not present, a sufficient capacitance cannot be obtained, with the result that it is difficult to obtain an electret excellent in performance. Furthermore, if not less than a predetermined height (distance) is not present, electric discharge (short circuit) occurs within a pore, with the result that it is difficult to accumulate charge. In contrast, if the height (distance) is excessively large, it is disadvantageous for charge polarization, with the result that it is difficult to obtain an electret excellent in stability. Because of this, it was considered that the larger the size (area) of individual pores within the porous resin film is, the more effectively they function. However, if the size of pores is excessively large, adjacent pores mutually communicate and electric discharge (short circuit) occurs between the adjacent pores; and conversely, it is difficult to accumulate charge.

As described above, since the porous resin film can stably accumulate a larger amount of charge, it is preferable that the porous resin film has a predetermined amount of pores having a predetermined size (effective for accumulating charge); and more specifically, in an observation image of the porous resin film in a sectional view, the film has pores having a height of 3 to 30 µm in the thickness direction of the film and a diameter of 50 to 500 µm in the planar direction of the film, preferably in a ratio of 100 pores/mm$^2$ or more, more preferably 150 pores/mm$^2$ or more, further preferably 200 pores/mm$^2$ or more, and particularly preferably 300 pores/mm$^2$ or more. In contrast, in view of, e.g., suppression of short circuit between adjacent pores and strength of a base material, pores having a height of 3 to 30 m in the thickness direction of the film and a diameter of 50 to 500 µm in the planar direction of the film are preferably present in a ratio of 3,000 pores/mm$^2$ or less, more preferably 2,500 pores/mm$^2$ or less, further preferably 2,000 pores/mm$^2$ or less, and particularly preferably 1,500 pores/mm$^2$ or less. As the number of effective pores increases in the porous resin film, charge accumulation ability improves and energy conversion efficiency tends to improve; however, the number of pores having a predetermined size in the film excessively increases, adjacent pores mutually communicate and the possibility of causing electric discharge (short circuit) between adjacent pores increases; and further the strength of the film itself decreases and resilience against external stress such as compression tends to decrease. If resilience against compression is insufficient, an adverse effect is exerted, for example, a recovery rate decreases as compression and restoration are repeated. Because of this, if the porous resin film is used as a piezoelectric element for converting mechanical energy to electric energy, disadvantages such as a short product life may occur. For the reason, it is preferable to control the shape and size of pores of the porous resin film in consideration of balance among these.

The porous resin film can be easily obtained, for example, by melt-kneading a resin composition containing a thermoplastic resin, which is a polymer material excellent in insulation, and a pore-forming nucleating agent, into a sheet, and stretching the sheet at a temperature higher than the glass transition temperature of the thermoplastic resin and lower than the melting point of the thermoplastic resin to form pores, which are developed from the pore-forming nucleating agent as a start point (nucleus), within the film.

The porosity of such a porous resin film may be appropriately set depending on, e.g., requisite performances, and is not particularly limited; however, the porosity is preferably 20 to 80%. The porosity has a correlation with the number of effective pores mentioned above. Note that, the porosity of the porous resin film refers to the volume ratio (volume fraction) of pores occupied in the total volume of the porous resin film. On the premise that pores are uniformly distributed in the whole resin film, the porosity of the porous resin film is equal to area proportion (area ratio) of pores occupied in the section of the resin film.

Accordingly, the porosity of the porous resin film can be provided as an value obtained by observing the section of the porous resin film by a scanning electron microscope, capturing an observed image with an image analyzer, analyzing an image of the observation area, and calculating the area ratio of pores in the section. More specifically, a sample for observing a section is prepared from a porous resin film or an energy conversion film by means of, e.g., a gallium focused ion beam such that pores are not collapsed. The sample (section) was observed by, e.g., a scanning electron microscope (trade name: JSM-6490, manufactured by JEOL Ltd.) at an appropriate magnification (for example, 2000×). The observation area of the section was photographed and analyzed by an image analyzer (trade name: LUZEX AP manufactured by NIRECO). The area proportion (area ratio) of pores occupied in the sample section is calculated. The obtained value can be specified as the porosity.

In contrast, if a material for the porous resin film is known or a resin composition having no pores formed is available, the porosity of the porous resin film can be calculated based on the following Expression 1:

[Expression 1]

$$\text{Porosity } (\%) = \frac{\rho_o - \rho}{\rho_o} \times 100 \quad \text{(Expression 1)}$$

$\rho_o$: True density of resin film measured in accordance with *JIS K7112*

$\rho$: Density of resin film measured in accordance with *JIS K7222*

In order to ensure storage capacitance of charge by providing as many pores as possible having a size suitable for accumulating charge within the film, the porosity of the porous resin film is preferably 20% or more, more preferably 25% or more, further preferably 30% or more, and particularly preferably 35% or more. In contrast, in order to suppress short circuit of charge caused by mutual communication of pores, suppress extreme reduction of the elastic modulus of the porous resin film, and suppress a reduction of resilience in the thickness direction resulting in low durability, the porosity of the porous resin film is preferably 80% or less, more preferably 70% or less, further preferably 60% or less, and particularly preferably 55% or less.

Hereinafter, the resin film or porous resin film will be sometimes collectively referred to as the "resin film". The thickness of the porous resin film preferably falls within the same range of the thickness of the aforementioned resin film.

[Material for Use in Porous Resin Film]

A porous resin film constituting the energy conversion film preferably contains a pore-forming nucleating agent in addition to a thermoplastic resin and a metal soap. More specifically, 50 to 98 mass % of a thermoplastic resin, 0.02 mass % to 20 mass % of a metal soap, and 1.98 to 49.98 mass % of a pore-forming nucleating agent are preferably contained based on the total mass of a single layer porous resin film (hereinafter sometimes referred to as a "single layer film basis"); more preferably, 60 to 97 mass % of a thermoplastic resin, 0.03 mass % to 10 mass % of a metal soap, and 2.97 to 39.97 mass % of a pore-forming nucleating agent are contained; further preferably, 65 to 96 mass % of a thermoplastic resin, 0.05 mass % to 5 mass % of a metal soap, and 3.95 to 34.95 mass % of a pore-forming nucleating agent are contained; and most preferably, 70 to 85 mass % of a thermoplastic resin, 0.1 mass % to 3 mass % of a metal soap, and 14.9 to 29.9 mass % of a pore-forming nucleating agent are contained. Note that, if the single layer porous resin film contains materials (described later) other than the three components, i.e., a thermoplastic resin, a metal soap, and a pore-forming nucleating agent, the total content ratio of the three components may be less than 100%.

If the energy conversion film has a laminate structure having, e.g., a core layer and skin layer as described later, 50 to 98 mass % of a thermoplastic resin, 0.02 mass % to 20 mass % of a metal soap, and 1.98 to 49.98 mass % of a pore-forming nucleating agent, are preferably contained based on the total mass of the laminate structure (hereinafter sometimes referred to as a "laminated film basis"); more preferably, 60 to 97 mass % of a thermoplastic resin, 0.03 mass % to 10 mass % of a metal soap, and 2.97 to 39.97 mass % of a pore-forming nucleating agent are contained; further preferably 65 to 96 mass % of a thermoplastic resin, 0.05 mass % to 5 mass % of a metal soap, and 3.95 to 34.95 mass % of a pore-forming nucleating agent are contained; and most preferably, 70 to 85 mass % of a thermoplastic resin, 0.1 mass % to 3 mass % of a metal soap, and 14.9 to 29.9 mass % of a pore-forming nucleating agent are contained. Note that, if the laminated film contains materials (described later) other than the three components, i.e., a thermoplastic resin, a metal soap, and a pore-forming nucleating agent, the total content ratio of the three components may be less than 100%.

[Thermoplastic Resin]

The thermoplastic resin for use in the resin film is used as a matrix resin for forming the resin film itself and provides a piezoelectric effect and resilience to the energy conversion film. As the thermoplastic resin suitable for use in the energy conversion film, an insulating polymer material rarely conducting electricity is preferable. Examples thereof include, but are not particularly limited to, polyolefin resins such as an ethylene resin including a high-density polyethylene, medium-density polyethylene, low-density polyethylene, a propylene resin, a polymethyl-1-pentene, and a cyclic polyolefin; functional group-containing polyolefin resins such as an ethylene-vinyl acetate copolymer, an ethylene-acrylic acid copolymer, a maleic acid modified polyethylene, and a maleic acid modified polypropylene; polyamide resins such as nylon-6 and nylon-6,6; polyester resins such as polyethylene terephthalate and a copolymer thereof, polybutylene terephthalate, polybutylene succinate, and polylactic acid; and polycarbonate, atactic polystyrene, and syndiotactic polystyrene. Of these thermoplastic resins, a polyolefin resin and a functional group-containing polyolefin resin, which are low in hygroscopic property and high in insulating property, are preferably used and a polyolefin resin is more preferably used. The thermoplastic resins may be used alone or in combination (two or more types).

Examples of the polyolefin resin include, but are not particularly limited to, homopolymers of olefins such as ethylene, propylene, butene, pentene, hexane, octene, butylene, butadiene, isoprene, chloroprene, methyl pentene, a cyclobutene, a cyclopentene, a cyclohexene, a norbornene, and a tricyclo-3-decene; and copolymers consisting of not less than two types of these olefins. Specific examples of the polyolefin resin include, but are not particularly limited to, a high-density polyethylene, a medium-density polyethylene, a propylene resin, a copolymer of ethylene with another olefin, and a copolymer of propylene and another olefin.

Of these polyolefin resins, an ethylene resin and a propylene resin are preferable, and a propylene resin including propylene homopolymers different in tacticity such as isotactic or syndiotactic, or a propylene copolymer obtained by copolymerization of a propylene as a main component with α-olefin such as ethylene, 1-butene, 1-hexane, 1-heptene, and 4-methyl-1-pentene, is further preferable in view of not only non-hygroscopicity and insulation property but also chargeability, processability, Young's modulus, durability, and cost. The propylene copolymer may be a bipolymer or a multiple polymer such as a terpolymer or more, a random copolymer or a block copolymer.

As a specific example of the functional group-containing polyolefin resin, a copolymer of each of the olefins mentioned above and a functional group-containing monomer copolymerizable with the olefin is mentioned. Examples of the functional group-containing monomer include, but are not particularly limited to, styrenes such as styrene and α-methylstyrene; vinyl carboxylate such as vinyl acetate, vinyl alcohol, vinyl propionate, vinyl butyrate, vinyl pivalate, vinyl caproate, vinyl laurate, vinyl stearate, vinyl benzoate, vinyl butyl benzoate, and vinyl cyclohexane carboxylate; (meth)acrylic acids; acrylic esters such as methyl (meth)acrylate, ethyl (meth)acrylate, butyl (meth)acrylate, hexyl (meth)acrylate, octyl (meth)acrylate, 2-ethylhexyl (meth)acrylate, stearyl (meth)acrylate, benzyl (meth)acrylate, cyclohexyl (meth)acrylate, isobonyl (meth)acrylate, dicyclopentanyl (meth)acrylate, (meth)acrylamide, and N-metallol (meth)acrylamide; and vinyl ethers such as methyl vinyl ether, ethyl vinyl ether, propyl vinyl ether, butyl vinyl ether, cyclopentyl vinyl ether, cyclohexyl vinyl ether, benzyl vinyl ether, and phenyl vinyl ether. Of these functional group-containing monomers, one or two monomers can be appropriately selected as needed, polymerized, and put in use.

Furthermore, these polyolefin resin and functional group-containing polyolefin resin can be graft-modified as needed and put in use. Graft modification can be carried out by a method known in the art, for example, graft modification of an unsaturated carboxylic acid or a derivative thereof can be mentioned. As the unsaturated carboxylic acid, (meth)acrylic acid, maleic acid, fumaric acid, and itaconic acid can be mentioned. As the derivative of an unsaturated carboxylic acid, an acid anhydride, an ester, an amide, an imide and a metal salt can be used. Specific examples thereof include, but are not particularly limited to, maleic anhydride, itaconic anhydride, citraconic anhydride, methyl (meth)acrylate, ethyl (meth)acrylate, butyl (meth)acrylate, glycidyl (meth)acrylate, monoethyl maleate, diethyl maleate, monomethyl fumarate, dimethyl fumarate, monomethyl itaconate, diethyl itaconate, (meth)acrylamide, maleic acid monoamide, maleic acid diamide, maleic acid-N-monoethylamide, maleic acid-N,N-diethylamide, maleic acid-N-monobutylamide, maleic acid-N,N-dibutylamide, fumaric acid monoamide, fumaric acid diamide, fumaric acid-N-monoethylamide, fumaric acid-N,N-diethylamide, fumaric acid-N-monobutylamide, fumaric acid-N,N-dibutylamide, maleimide, N-butyl maleimide, N-phenylmaleimide, sodium (meth)acrylate, and potassium (meth)acrylate.

As the graft modified product, a graft modified product obtained by adding a graft monomer to at least one of polyolefin resin and functional group-containing polyolefin resin, usually in a ratio of 0.005 to 10 mass % and preferably 0.01 to 5 mass % is mentioned.

As the thermoplastic resin to be suitably used in the porous resin film, a single resin may be selected from the thermoplastic resins mentioned above and used alone or two types or more resins are selected and used in combination.

The content (content rate) of the thermoplastic resin in the resin film is not particularly limited and may be appropriately set in order to form a sufficient interface, which is made of a matrix resin of the porous resin film, between pores in the film, suppress mutual communication between pores, and ensure mechanical strength of the porous resin film. More specifically, the content of the thermoplastic resin based on the total mass of the resin film is preferably 50 mass % or more, more preferably 60 mass % or more, further preferably 65 mass % or more, and particularly preferably 70 mass % or more. On the other hand, the content of the thermoplastic resin is preferably 98 mass % or less, more preferably 97 mass % or less, further preferably 96 mass % or less, and particularly preferably 85 mass % or less.

[Metal Soap]

Conventionally, if a resin film contains a metal soap, the dielectric constant of the resin film is high compared to a resin film containing a charge control agent. In this case, it is considered that the charge retention performance thereof is low; at the same time, the heat resistance is low. However, according to the studies of the present inventors, it was found that if a metal soap is contained, the resin film has the same chargeability as in a film containing a charge control agent and is further excellent in heat resistance. More specifically, the charge retention performance of the resin film increases by the content of a metal soap in the resin film, and, the energy conversion film obtained by electretization of the resin film is rarely reduced in piezoelectricity, even if it is stored or used in a high temperature environment.

As the metal soap suitable for use in the energy conversion film, a metal soap, which melts in a kneading stage of the material for the resin film and uniformly disperses in a thermoplastic resin, and which is a solid at a temperature of an operation environment and storage of an energy conversion film and an energy conversion element using the film, is preferably used, since high charge retention performance is easily produced. Because of this, the melting point of the metal soap falls within the range of preferably 50° C. or more and the melting temperature of a thermoplastic resin+50° C. or less, more preferably 70° C. or more and the melting temperature of a thermoplastic resin+40° C. or less, and further preferably 100° C. or more and the melting temperature of a thermoplastic resin+30° C. or less. For example, if a polypropylene resin (melting point 160 to 170° C.) is used as the thermoplastic resin, a metal soap having a melting point of 50° C. to 220° C. is preferably used, a metal soap having a melting point of 70° C. to 210° C. is more preferably used, and a metal soap having a melting point of 100° C. to 200° C. is further preferably used.

If a metal soap has a melting point within the aforementioned preferable temperature range, the metal soap melts during production of a resin film, uniformly disperses in a thermoplastic resin; and is solidified (less flowable) while keeping a dispersion state in the thermoplastic resin after the resin film is molded. Then, during an electretization process, a metal soap is oriented due to a dipole within the molecule. It is presumed that the charge retention performance of the energy conversion film is enhanced by the orientation of a metal soap.

The metal soap is preferably a metal salt of a fatty acid and more preferably a metal salt of a higher fatty acid. As the fatty acid herein, a saturated and unsaturated fatty acid having 5 to 30 carbon atoms, preferably 6 to 28 carbon atoms, more preferably 8 to 24 carbon atoms, and further preferably 10 to 20 carbon atoms, and structural isomers of these, are mentioned. Note that the number of carbon atoms refers to the amount per molecule of a fatty acid.

Specific examples of the saturated fatty acid include, but are not particularly limited to, pentanoic acid, hexanoic acid, heptanoic acid, octanoic acid, nonanoic acid, decanoic acid, dodecanoic acid, tetradecanoic acid, pentadecanoic acid, hexadecanoic acid, heptadecanoic acid, octadecanoic acid, 12-hydroxyoctadecanoic acid, icosanoic acid, docosanoic acid, tetracosanoic acid, hexacosanoic acid, and octacosanoic acid.

Specific examples of the unsaturated fatty acid include, but are not particularly limited to, trans-2-butenoic acid, 9-tetradecenoic acid, 9-hexadecenoic acid, cis-6-hexadecenoic acid, cis-9-octadecenoic acid, trans-9-octadecenoic acid, cis-9-icosenoic acid, cis-13-docosenoic acid, cis-15-tetracosenoic acid, cis, cis-9,12-octadecadienoic acid, 9,11,13-octadecatrienoic acid, cis, cis, cis-9,12,15-octadecatrienoic acid, cis, cis, cis-8,11,14-icosatrienoic acid, 6,9,12,15-octadecatetraenoic acid, 5,8,10,12,14-octadecapentaenoic acid, and 4,7,10,13,16,19-docosahexaenoic acid.

Of these fatty acids, a saturated fatty acid is preferably used since a metal salt of the saturated fatty acid tends to have a high melting point, with the result that an energy conversion film improved in heat resistance tends to be easily obtained.

A metal element of a metal soap is not particularly limited as long as it forms a stable salt with a fatty acid. In view of the melting point and charge retention performance of the resultant metal soap, usually at least one monovalent, divalent, or trivalent metal, i.e., a metal element belonging to group 1 to group 13 of the periodic table (old group IA to IIIB) is preferably used; at least one divalent or trivalent metal, i.e., a metal element belonging to group 2 to group 13 of the periodic table (old group IIA to IIIB) is more preferably used; and at least one metal element belonging to group 2, group 12, and group 13 of the periodic table (old group IIA, IIB, and IIIB) is further preferably used. More specifically, at least one of sodium (group 1), magnesium (group 2), calcium (group 2), barium (group 2), zinc (group 12), and aluminum (group 13) is further preferably used. In particular, in view of safety, at least one of calcium, zinc, and aluminum is particularly preferably used; in order to enhance charge retention performance more, calcium or aluminum is particularly preferably used and aluminum is most preferably used. The metal soap may be a basic salt.

The metal soap most preferably used in the energy conversion film of the present invention is a saturated higher fatty acid aluminum salt. Specific examples of the saturated higher fatty acid aluminum salt include, but are not particularly limited to, dihydroxyaluminum octadecanoate, hydroxyaluminum dioctadecanoate, aluminum trioctadecanoate, dihydroxyaluminum dodecanoate, hydroxyaluminum didodecanoate, aluminum tridodecanoate, dihydroxyaluminum 2-ethylhexanoate, hydroxyaluminum di-2-ethyl hexanoate, and aluminum tri-2-ethylhexanoate.

The metal soaps as mentioned above are usually used in the plastic industry as additives (for example, stabilizer, lubricant, filler dispersant, eye mucus inhibitor, fluidity improver, nucleating agent, or anti-blocking agent). However, in the energy conversion film of the present invention, a metal soap is added in order to enhance chargeability of the film, particularly as a functional agent of suppressing a reduction of piezoelectricity of a conventional energy conversion film under a high temperature environment. Accordingly, in the present invention for suppressing a reduction in piezoelectricity of the energy conversion element, a metal soap is preferably added in a relatively larger amount than the content (for example, 0.01 mass %) of a metal salt to be added as an additive generally used in conventional films.

The content of a metal soap in a resin film, relative to a composition (100 mass %) containing a thermoplastic resin and a metal soap constituting a single-layer resin film (hereinafter sometimes referred to as a "composition basis" of a single-layer resin film), in view of charge retention performance, is preferably 0.02 mass % or more, more preferably 0.03 mass % or more, further preferably 0.05 mass % or more, particularly preferably 0.1 mass % or more, and most preferably 0.2 mass % or more.

Even if the metal soap is excessively added to a composition (100 mass %) containing a thermoplastic resin and a metal soap constituting a single-layer resin film, the effect is no more increased and an adverse effect such as bleed out increases. Because of this, the content of the metal soap relative to the composition (100 mass %) containing a thermoplastic resin and a metal soap (hereinafter sometimes referred to as a "composition basis" of a single-layer resin film) is preferably 20 mass % or less, more preferably 10 mass % or less, further preferably 5 mass % or less, particularly preferably 3 mass % or less, and most preferably 0.7 mass % or less.

[Pore-Forming Nucleating Agent]

The pore-forming nucleating agent to be used in the porous resin film is added as nuclei for forming pores in the film. As the pore-forming nucleating agent suitable for use in the porous resin film, an inorganic fine powder and an organic filler are mentioned. Owing to addition of the pore-forming nucleating agent and a stretching step (described later), pores can be formed within the film. The frequency of appearance of pores can be controlled by controlling the content of the pore-forming nucleating agent and the size (height and diameter) can be controlled by varying the particle size of the pore-forming nucleating agent.

If the resin film contains a pore-forming nucleating agent, the content of the pore-forming nucleating agent relative to the total amount of the resin film, in order to form a sufficient number of pores in the resin film, is preferably 2 mass % or more, more preferably 4 mass % or more, further preferably 10 mass % or more, and particularly preferably 14 mass % or more. In contrast, in order to suppress mutual communication between pores in the resin film, the content of the pore-forming nucleating agent relative to the total amount of the resin film is preferably 50 mass % or less, more preferably 40 mass % or less, further preferably 30 mass % or less, and particularly preferably 25 mass % or less.

As the pore-forming nucleating agent, an inorganic fine powder alone or an organic filler alone, or a combination of an inorganic fine powder and an organic filler can be used in the aforementioned content. If an inorganic fine powder and an organic filler are used in combination, the content ratio of them is not particularly limited. For example, a pore-forming nucleating agent containing 10 to 99 mass %, 20 to 90 mass %, and 30 to 80 mass % of an inorganic fine powder relative to the total amount of the pore-forming nucleating agent may be used.

The content of the pore-forming nucleating agent is as mentioned above. If the content ratio of the pore-forming nucleating agent is the lower limit or more of the aforementioned preferable range, a sufficient number of pores having suitable size for accumulating charge can be easily obtained in a stretching step (described later), with the result that desired piezoelectricity can be easily obtained. In contrast, if the content ratio of the pore-forming nucleating agent is the upper limit or less of the aforementioned preferable range, formation of an excessive number of pores is suppressed, thereby easily suppressing a reduction of film strength. As a result, in the resultant electret material, even if compressive force is repeatedly applied, it is easy to sufficiently recover from compression and further a stable piezoelectricity can be expectedly obtained.

[Inorganic Fine Powder]

Of the pore-forming nucleating agents, an inorganic fine powder is inexpensive and many types of products different in particle size are commercially available. Specific examples of the available inorganic fine powder include, but are not particularly limited to, calcium carbonate, baked clay, silica, diatom earth, clay, talc, titanium oxide, barium sulfate, alumina, zeolite, mica, sericite, bentonite, sepiolite, vermiculite, dolomite, wollastonite, and glass fiber. The inorganic fine powders may be used alone or in combination (two or more types).

The volume average particle diameter (median diameter ($D_{50}$) measured by a particle size analyzer based on laser diffraction) of an inorganic fine powder can be appropriately selected in consideration of molding of pore size suitable for accumulating charge and is not particularly limited. Since pores having a proper size are formed and a desired piezoelectricity can be easily obtained, the volume average particle diameter of an inorganic fine powder is preferably 3 µm or more, more preferably 4 µm or more, and further preferably 5 µm or more. In contrast, in order to suppress formation of coarse pores, thereby suppressing mutual communication of adjacent pores to prevent short circuit and difficulty of charge accumulation, and to suppress formation of excessively large pores, thereby suppressing a reduction of film strength; and, in the resultant electret, in order to attain a sufficient recovery from compression even if a compressive force is repeatedly applied, thereby expectedly stabilizing piezoelectricity, the volume average particle diameter of an inorganic fine powder is preferably 30 µm or less, more preferably 20 µm or less, and further preferably 15 µm or less.

[Organic Filler]

Of the pore-forming nucleating agents, an organic filler is preferable since spherical particles uniform in diameter are available and pores uniform in shape and size can be easily prepared in a porous resin film. In addition, after pores are formed, the organic filler also serves as a support in the pores. Because of this, pores rarely collapse and, in the resultant electret, a sufficient recovery from compression can be attained even if a compressive force is repeatedly applied and further stable piezoelectricity (pillar effect) is expected.

As the organic filler, it is preferable to select a resin particle different in type from a thermoplastic resin serving as a main component of the porous resin film. For example, if the thermoplastic resin is a polyolefin resin, as a preferable organic filler, an organic filler incompatible with polyolefin and non-flowable during kneading and stretching of the polyolefin resin, is mentioned, Specific examples thereof include, but are not particularly limited to, a crosslinked acrylic resin, a crosslinked methacrylic resin, a crosslinked styrene resin, and a crosslinked urethane resin. The resin particles formed of these crosslinked resins are particularly preferably used since spherical particles uniform in diameter are available and pore size can be easily adjusted.

The organic filler is incompatible with a thermoplastic resin serving as a main component of the porous resin film; however, it is melt-kneaded with the thermoplastic resin to form a sea-island structure. The organic filler, which forms an island, may serve as nuclei of pores during stretching to form desired pores. For example, if the thermoplastic resin is a polyolefin resin, specific examples of the organic filler include polymers, such as polyethylene terephthalate, polybutylene terephthalate, polycarbonate, nylon-6, nylon-6,6, cyclic olefin polymer, polystyrene, and polymethacrylate, having a higher melting point (for example, 170 to 300° C.) than that of the polyolefin resin or a higher glass transition temperature (for example, 170 to 280° C.) than the melting point thereof, and being finely dispersed in the polyolefin resin serving as matrix resin by melt kneading. The organic fillers can be used alone or in combination (two or more types). As the pore-forming nucleating agent, an inorganic fine powder as mentioned above and an organic filler as mentioned above can be used in combination with the inorganic fine powder mentioned above.

The volume average particle diameter (median diameter ($D_{50}$) measured by a particle size analyzer based on laser diffraction) of the organic filler can be appropriately selected in consideration of molding of pore size suitable for accumulating charge and is not particularly limited. Since pores having a proper size are formed and a desired piezoelectricity can be easily obtained, the volume average particle diameter of an organic filler is preferably 3 µm or more, more preferably 4 µm or more, and further preferably 5 µm or more. In contrast, in order to suppress formation of coarse pores, thereby suppressing mutual communication of adjacent pores to prevent short circuit and difficulty of charge accumulation, and to suppress formation of excessively large pores, thereby suppressing a reduction of film strength; and, in the resultant electret, in order to attain a sufficient recovery from compression even if a compressive force is repeatedly applied, thereby expectedly stabilizing piezoelectricity, the volume average particle diameter of an organic filler is preferably 30 µm or less, more preferably 20 µm or less, and further preferably 15 µm or less.

If an inorganic fine powder and an organic filler are used in combination as the pore-forming nucleating agent, a single type or more of inorganic fine powder selected from the aforementioned examples thereof and a single type or more of organic filler selected from the aforementioned examples thereof are used in combination. Also, in this case, for the same reasons mentioned above, the volume average particle diameter of the mixture falls within the range of preferably 3 to 30 µm, more preferably 4 to 20 µm, and further preferably 5 to 15 µm.

When an inorganic fine powder and an organic filler used in combination, the inorganic fine powder and the organic filler each having a volume average particle diameter within the same range may be used in combination; or a mixture of an inorganic fine powder and an organic filler having a volume average particle diameter (measured by a particle size analyzer based on laser diffraction) within the same range, may be used.

[Other Materials]

The resin film may optionally contain additives such as a dispersant, a heat stabilizer (antioxidant), and a light stabilizer, as needed.

When a dispersant is added, in order to suppress unintentional formation of coarse pores or mutually communicating pores due to dispersion failure of a pore-forming nucleating agent, the content of the dispersant based on the total mass of the resin film is preferably 0.01 mass % or more, more preferably 0.03 mass % or more, and further preferably 0.05 mass % or more. In contrast, in view of formability and charge retention of the resin film, the content of the dispersant based on the total mass of the resin film is 10 mass % or less, more preferably 5 mass % or less, and further preferably 2 mass % or less. Specific examples of the dispersant include, but are not particularly limited to, a fatty acid, a glycerin fatty acid, a polyglycerin fatty acid ester, a sorbitan fatty acid ester, a silane coupling agent, and a poly(meth)acrylic acid, and salts of these.

When a heat stabilizer is added, the addition amount thereof based on the total mass of the resin film usually falls within the range of 0.001 to 1 mass %. Specific examples of the heat stabilizer include, but are not particularly limited to, sterically hindered phenol, phosphorous, and amine heat stabilizers. These heat stabilizers are considered to have a charge retention performance although the performance is not excellent as that of a metal soap. Particularly a metal soap, if it is used in combination with a sterically hindered phenol or phosphorous heat stabilizer, the charge retention performance tends to be improved.

Basically, a heat stabilizer preferably has a high melting point in view of charge retention performance; however, in order to uniformly disperse a heat stabilizer in the energy conversion film, the melting point of a heat stabilizer is preferably low. Thus, the melting point of a heat stabilizer preferably falls within the same range as that of a metal soap.

To sufficiently produce the charge retention performance of a metal soap, the ratio of a metal soap to the total amount of a heat stabilizer is preferably 1:0.2 to 1:100, more preferably 1:0.5 to 1:50 further preferably 1:1 to 1:10, and most preferably 1:2 to 1:5.

When a light stabilizer is added, the addition amount thereof based on the total mass of the resin film usually falls within the range of 0.001 to 1 mass %. Specific examples of the light stabilizer include, but are not particularly limited to, sterically hindered amine, benzotriazole, and benzophenone light stabilizers.

[Laminate Structure of Resin Film or Porous Resin Film]

The resin film or porous resin film may be a film having a single-layer structure formed of the aforementioned resin composition or a resin film having a multilayer structure including at least one of the single-layer resin film. The resin film or porous resin film is preferably a resin film (laminated resin film) of a multilayer laminate structure having at least a core layer and a skin layer and more preferably a three layered structure consisting of skin layer/core layer/skin layer.

[Core Layer]

If a resin film has a laminate structure having a core layer and a skin layer, the resin film or porous resin film mentioned above is employed as a core layer and a skin layer is further provided on the core layer. Hereinafter, the resin film or porous resin film will be sometimes referred to as a core layer.

The thickness of the core layer measured by a method (described later) is preferably 10 m or more, more preferably 20 µm or more, further preferably 30 µm or more, and particularly preferably 40 µm or more. If so, the volume required for accumulation of internal charge effectively functioning for energy conversion can be easily obtained. Particularly in the case of a porous resin film, a desired number of pores having an appropriate size for accumulation of internal charge can be easily and uniformly formed. In contrast, the thickness of the core layer is preferably 500 µm or less, more preferably 300 µm or less, further preferably 150 µm or less, and particularly preferably 120 µm or less. If so, when the resin film is converted into an electret by applying an electretization process (charge injection process and DC high voltage discharge process) described later to obtain an energy conversion film, charge can be delivered within the interior layer, with the result that a desired performance of the present invention can be easily produced.

[Skin Layer]

The skin layer is laminated on at least one of the two surfaces of the resin film or porous resin film (core layer). The skin layer is laminated on preferably at least one of the two surfaces of the core layer as a layer protecting the core layer and on more preferably the two surfaces of the core layer. Owing to the skin layer provided on a surface of the core layer, it is possible to barrier a metal soap, which may possibly breed out from the resin film outside the system; further it is possible to easily prevent communication of pores formed in the porous resin film with the outside, thereby preventing release of the charge stored within the pores into the atmosphere; and further, the surface strength of the porous resin film can be improved. In addition, since the surface becomes smooth, adhesiveness to an electrode can be improved.

The skin layer is also preferably formed of a film containing a thermoplastic resin. As the thermoplastic resin constituting the skin layer, the same resin as described in the section of [Thermoplastic resin] for use in a resin film, can be used.

The skin layer herein may or may not contain a metal soap similarly to the core layer. If the skin layer is used as a protective layer for the core layer, it is preferable that a metal soap is not contained in the skin layer. If the skin layer contains a metal soap, the content of the metal soap is preferably lower than that of the core layer.

The skin layer preferably has a composition from which pores are not easily formed, compared to that of the core layer, or has a structure having a lower porosity than the core layer. Such a skin layer can be formed by, e.g., a method of controlling the content of the pore-forming nucleating agent to be lower than that of the core layer; a method of controlling the volume average particle diameter of the pore-forming nucleating agent to be used in skin layer, to be lower than that used in the core layer; or a method of distinguishing the stretch ratio of the core layer from the skin layer, for example, by forming the core layer by biaxial stretching and the skin layer by uniaxial stretching.

The skin layer may or may not contain the pore-forming nucleating agent. In order to improve the physical strength of the skin layer and the durability of the core layer, it is preferable that a pore-forming nucleating agent is not contained. In order to modify the dielectric constant of the skin layer and the electrical characteristics of the core layer, the pore-forming nucleating agent is preferably contained. If the skin layer contains the pore-forming nucleating agent, the same agent as described in the section of [Pore-forming nucleating agent] for use in a porous resin film, can be used. As the pore-forming nucleating agent for the skin layer herein, the same or different pore-forming nucleating agent as used for the porous resin film may be used.

Particularly, the organic filler usually has a higher dielectric constant than the thermoplastic resin to be used in the porous resin film. Because of this, the organic filler is favorable for improving the electrical characteristics of the skin film. Particularly when a resin having a relatively low dielectric constant such as a polyolefin resin is used as the thermoplastic resin of the skin layer, if an organic filler is added to the skin layer, it is easy to deliver charge up to the interior of the resin film (inside the core layer) due to its dielectric effect at the time of application of a high voltage during an electretization process. Conversely, after the electretization process, due to low dielectric properties of a main component, polyolefin resin, charge within the resin film can be retained without releasing.

If the pore-forming nucleating agent is contained in the skin layer, the same dispersant as described in the section of [Dispersant] for use in a porous resin film, can be used.

The skin layer is preferably stretched. Uniformity in thickness (film thickness) of the skin layer and uniformity of electrical characteristics such as insulation voltage can be improved by a stretching step specifically described later. If the thickness of the skin layer is not uniform, electric discharge is likely to occur locally and intensively at a portion of the skin layer low in thickness at the time of charge injection using a high voltage. As a result, it tends to be difficult to apply high voltage for effectively injecting a charge.

Note that, the skin layer may have not only a single layer structure but also a multilayer structure of two layers or more. In the case of the multilayer structure, a porous resin film of a multilayer structure having a higher charge retention performance can be easily designed by changing a type and content of thermoplastic resin, pore-forming nucleating agent, and dispersant to be used in individual layers.

In the case of providing the skin layer on the upper and lower surfaces of the core layer, e.g., the composition, constitution, and thickness of both the upper and lower skin layers may be the same or different.

If a skin layer is provided on the upper surface of the core layer, the thickness of the skin layer, which is not particularly limited, is preferably 0.1 µm or more, more preferably 0.3 µm or more, further preferably 0.5 µm or more, and particularly preferably 0.7 µm or more. If so, a skin layer can be easily and uniformly provided and uniform charge injection and improvement of insulation voltage can be expected. In contrast, the thickness of the skin layer is preferably 100 m or less, more preferably 50 µm or less, further preferably 30 µm or less, and particularly preferably 10 µm or less. If so, at the time of charge injection into a multilayer porous resin film, charge tends to easily be delivered up to the core layer within the film.

The skin layer is preferably thinner than the core layer. Since it is difficult to elastically deform the skin layer in the thickness direction, relative to the core layer, an energy conversion efficiency can be easily maintained without reducing the compressive modulus of, e.g., porous resin film, by suppressing the thickness of the skin layer.

The thickness ratio (core layer/skin layer) of the core layer and the skin layer is preferably 1.1 to 1000, more preferably 2 to 300, further preferably 5 to 150, and particularly preferably 10 to 50. Note that if a plurality of skin layers are used, the ratio value is calculated based on the total thickness value.

[Formation of Resin Film]

In producing the resin film, various methods conventionally known in the art can be used. For example, if the resin film is a single-layer film, a resin composition containing the aforementioned raw materials may be melt-kneaded, extruded from a single dice, and, if necessary, stretched. If the resin film is a multilayer having the core layer and the skin layer, a multilayer resin film having both layers stacked can be produced by a co-extrusion method using a multilayer die using a feed block and a multi manifold, or by an extrusion lamination method using a plurality of dies. Furthermore, the resin film can be produced by the co-extrusion method using a multilayer die in combination with the extrusion lamination method.

The uniformity in thickness of the resin film is important because insulation voltage is improved to improve a charge injection efficiency and the piezoelectric efficiency of the resultant energy conversion film.

The resin film is preferably a stretched film along at least a single direction. The uniformity in thickness of a resin film is improved by stretching. In the case of a porous resin film, a large number of pores are formed within the film by stretching. In the case of a multilayer resin film having a core layer and a skin layer, it is preferable that the skin layer is stacked on the core layer, and thereafter, the resin film is stretched along at least a single direction. By stretching the resin film after the skin layer is laminated on the core layer, the uniformity of film thickness is improved compared to the case where stretched films are mutually stacked, with the result that electrical characteristics are improved.

It is desirable that the pores formed in a porous resin film by stretching each have a relatively large volume in order to retain charge, are present relatively in a large number, and mutually have a discrete shape. The size of pores is easily increased by biaxial stretching than uniaxial stretching. Particularly, in the film obtained by biaxial stretching along the width direction and the machine direction, disk-like pores stretched in the planar direction can be formed around a pore-forming nucleating agent. Because of this, it is easy to accumulate charge positively and negatively polarized by an electretization within pores, and thus, excellent charge retention performance is obtained. Accordingly, the porous resin film is preferably a biaxially stretched film.

The resin film can be stretched by various methods known in the art. Specific examples thereof may include a longitudinal stretching method using difference in peripheral speed of rolls, a transverse stretching method using a tenter oven, a sequential biaxial stretching method in which the longitudinal stretching and transverse stretching are carried out in the normal order or the reverse order, a rolling method, a simultaneous biaxial stretching method using a tenter oven and a linear motor in combination, and a simultaneous biaxial stretching method using a tenter oven and a pantograph in combination. Furthermore, a simultaneous biaxial stretching method based on a tubular method, which is a stretching method for an inflation film, can be mentioned.

A temperature during the stretch process is preferably from a glass transition temperature of a major thermoplastic resin (the resin used in a largest mass ratio) used in the resin film to a melting point of a crystal portion of the major thermoplastic resin—1 to 70° C. More specifically, if the thermoplastic resin is a propylene homopolymer (melting point 155 to 167° C.), the temperature during the stretch process preferably falls within the range of 100 to 166° C. If the thermoplastic resin is a high density polyethylene (melting point 121 to 136° C.), the temperature during the stretch process preferably falls within the range of 70 to 135° C. If a multilayer resin film is stretched, the temperature during the stretch process is preferably set in consideration of the stretching efficiency of a layer (usually, core layer)

having the largest predetermined basis weight or a layer (usually, core layer) having the highest predetermined porosity. It is a matter of course that if the stretching temperatures are determined based on thermoplastic resin different in a melting point or a glass transition temperature, which are used separately in the core layer and skin layer of the resin film, it is possible to separately control the porosity of the individual layers.

The stretch ratio is not particularly limited and may be appropriately determined in consideration of, e.g., stretching characteristics of the thermoplastic resin to be used in the resin film and a predetermined porosity as mentioned above. For example, if a propylene homopolymer or a propylene copolymer is used as the thermoplastic resin, the stretch ratio in a uniaxial direction is preferably 1.2 or more and more preferably 2 or more, whereas the upper limit of the stretch ratio is preferably 12 or less and more preferably 10 or less. In the case of biaxial stretching, the area stretch ratio (a product of a longitudinal stretch ratio and a lateral stretch ratio) is preferably 1.5 or more and more preferably 4 or more; whereas the upper limit of the stretch ratio is preferably 60 or less and more preferably 50 or less.

If other thermoplastic resin are used, the stretch ratio in a uniaxial direction is preferably 1.2 or more and more preferably 2 or more; whereas the upper limit thereof is preferably 10 or less and more preferably 5 or less. In the case of biaxial stretching, the area stretch ratio is preferably 1.5 or more and more preferably 4 or more; whereas, the upper limit thereof is preferably 20 or less and more preferably 12 or less.

In the porous resin film, in the case of biaxial stretching, the longitudinal stretch ratio and the lateral stretch ratio are preferably set as equal as possible, because disk-like pores, which are easy to accumulate charge, are formed and the shape and frequency of appearance of the pores observed in a sectional view in an arbitrary direction are easily controlled to fall within the preferable range of the present invention. For the reason, in the case of biaxial stretching, the ratio of the longitudinal stretch ratio and the lateral stretch ratio is preferably 0.4 or more, more preferably 0.5 or more, further preferably 0.7 or more, and particularly preferably 0.8 or more; whereas the upper limit thereof is preferably 2.5 or less, more preferably 2.0 or less, further preferably 1.5 or less, and particularly preferably 1.3 or less. The stretching speed preferably falls within the range of 20 to 350 m/minutes in view of stable molding by stretching.

[Surface Treatment]

To one or two surfaces of the resin film, a surface treatment can be applied by a method known in the art in order to improve adhesion to other materials such as a material for e.g., an electrode (described later). As specific examples of the surface treatment, a corona discharge treatment, a flame plasma treatment, and an atmospheric pressure plasma treatment can be mentioned. By replacing the surface treatment environment and a plasma generation source with a desired gas, adhesion of the resin film can be improved. Further, adhesion can be improved by washing the surface(s) of the resin film with an acid such as hydrochloric acid, nitric acid, and sulfuric acid.

[Anchor Coat Layer]

In order to improve adhesion to an electrode (described later), an anchor coat layer may be provided on one or two surfaces of the resin film.

In the anchor coat layer, a polymer binder is preferably used in order to improve adhesion between the resin film and the electrode. Specific examples of the polymer binder include, but are not particularly limited to, polyethylene- imine polymers such as polyethyleneimine, an alkyl modified polyethyleneimine having 1 to 12 carbon atoms, and poly(ethyleneimine-urea); polyamine polyamide polymers such as an ethylene imine adduct of a polyamine polyamide and an epichlorohydrin adduct of a polyamine polyamide; acrylic acid ester polymers such as an acrylic acid amide-acrylic acid ester copolymer, an acrylic acid amide-acrylic acid ester-methacrylic acid ester copolymer, a polyacrylamide derivative, and an oxazoline group-containing acrylic acid ester polymer; polyvinyl alcohol polymers including a polyvinyl alcohol and a modified polyvinyl alcohol; water-soluble resin such as polyvinylpyrrolidone and polyethylene glycol; modified polypropylene polymers such as chlorinated polypropylene, maleic acid-modified polypropylene, and acrylic acid-modified polypropylene; and water-insoluble resins such as polyvinyl acetate, polyurethane, an ethylene-vinyl acetate copolymer, polyvinylidene chloride, an acryl nitrile-butadiene copolymer and polyester. Of them, a polyethyleneimine polymer, a polyamine polyamide polymer, a polyvinyl alcohol polymer, and a modified polypropylene polymer are preferable because adhesion to the resin film is excellent.

As a method for providing an anchor coat layer on the resin film, various methods known in the art can be used. Although the method for providing an anchor coat layer is not particularly limited, a method of applying an application liquid containing a polymer binder as mentioned above onto the resin film is preferable. More specifically, the anchor coat layer can be formed by forming a coating film of the application liquid by use of a coating applicator known in the art on the resin film, followed by drying.

The application liquid is prepared such that a polymer binder can be applied by a method known in the art, in the form of an aqueous solution or an aqueous dispersion solution, if the polymer binder is a water-soluble resin; or in the form of an organic solvent solution or an aqueous dispersion, if the polymer binder is a water-insoluble resin.

Specific examples of the coating applicator include, but are not particularly limited to, a die coater, a bar coater, a comma coater, a rip coater, a roll coater, a curtain coater, a gravure coater, a squeeze coater, a spray coater, a blade coater, a reverse coater, an air knife coater, and a size press coater.

If the anchor coat layer is provided on the resin film, the basis weight thereof is not particularly limited; however, in order to improve adhesion between the resin film and the electrode, the basis weight thereof in terms of solid content is preferably 0.001 $g/m^2$ or more, more preferably 0.005 $g/m^2$ or more, and particularly preferably 0.01 $g/m^2$ or more; whereas, in order to uniformly keep the film thickness of a coating layer, i.e., the anchor coat layer, the basis weight thereof in terms of solid content is preferably 5 $g/m^2$ or less, more preferably 3 $g/m^2$ or less, and particularly preferably 1 $g/m^2$ or less. Note that, if the film thickness of the coating layer, i.e., the anchor coat layer, cannot be uniformly kept, in-plane uniformity of the electrical characteristics of the resin film is damaged by the difference in film thickness and adhesion between the resin film and the electrode is lowered due to an insufficient cohesion force of the anchor coat layer itself. Furthermore, the surface resistance value of the anchor coat layer decreases up to less than $1\times10^{13}\Omega$, with the result that charge tends to easily travel away along the surface in an electretization of the resin film and it becomes difficult to injection charge within the resin film. Since charge cannot be delivered within the resin film, the desired performance of the present invention may sometimes be rarely produced.

The timing for providing the anchor coat layer on the resin film may be before or after the electretization process (specifically described later).

[Pressurization Process]

Inner pores can be further expanded by a pressurization process of the porous resin film. The pressurization process is carried out by placing a porous resin film in a pressure container and pressurizing the interior of the container with an unreactive gas. In this manner, the unreactive gas is allowed to penetrate into pores, and thereafter, the porous resin film is released under a non-pressurized condition.

As specific examples of the unreactive gas to be used, inert gases such as nitrogen, carbon dioxide, argon, helium, or a mixture of these gases and air are mentioned. If a gas other than the unreactive gases is used, the expansion effect can be obtained; however, in view of safety during the pressurization process and safety of the porous resin film to be obtained, an unreactive gas is desirably used. The pressure during the pressurization process is not particularly limited; however, the pressure preferably falls within the range of 0.2 to 10 MPa, more preferably 0.3 to 8 MPa, and further preferably 0.4 to 6 MPa. If the pressure is less than 0.2 MPa, a sufficient expansion effect tends to be rarely obtained since the pressure is low. In contrast, if the pressure exceeds 10 MPa, when the porous resin layer is released under a non-pressurized condition, the wall of pores cannot bear the internal pressure and collapses, with the result that it tends to be difficult for the pores to be present in the form of independent holes. The time for the pressurization process is not particularly limited; however, the time is preferably one hour or more and more preferably falls within the range of 1 to 50 hours. If the processing time is less than one hour, it is difficult to sufficiently fill a pore with an unreactive gas. In the porous resin film having pores sufficiently filled with an unreactive gas within less than one hour, the unreactive gas is dissipated during a heat treatment (described later). Because of this, it tends to be difficult to obtain a stable expansion effect.

When the winding roll for a porous resin film is subjected to a pressurization process, it is desirable that the porous resin film is wound up together with a buffer sheet in advance and then subjected to the pressurization process in order for an unreactive gas to easily penetrate within the winding roll. As specific examples of the buffer sheet, sheets having void spaces in communicating with each other, such as a foamed polystyrene sheet, a foamed polyethylene sheet, a foamed polypropylene sheet, a nonwoven fabric, a woven fabric, and paper, can be used.

[Heat Treatment]

To the porous resin film to which the pressurization process is applied, a heat treatment is preferably applied in order to maintain its expansion effect. A porous resin film is expanded by applying a pressurization process, and thereafter, releasing the porous resin film under an unpressurized condition. However, if the porous resin film is allowed to stand still as it is, the unreactive gas penetrating into pores is gradually released, with the result that the porous resin film may sometimes have the original thickness. Then, it is desirable to subject the expanded porous resin film to a heat treatment to accelerate crystallization of a thermoplastic resin in order to maintain the expansion effect even after the inner pressure of the pores reduces to the atmospheric pressure. The heat treatment can be carried out within the temperature range from the glass transition temperature or more of a thermoplastic resin mainly used in the porous resin film to the melting point or less of a crystal part thereof. More specifically, if the thermoplastic resin is, for example, a propylene homopolymer (melting point 155 to 167° C.), the temperature of the heat treatment falls within the range of 80 to 160° C. As the heating method, a method known in the art can be used. Specific examples of the method include, but are not particularly limited to, heating with hot air supplied from a nozzle, radiation heating with an infrared heater, and contact heating with a roll equipped with a temperature controller. Note that, since the elastic modulus of the porous resin film decreases during the heat treatment, if weight is applied, the pores easily collapse. For the reason, a non-contact heat treatment such as hot-air heating and radiation heating is preferable since high expansion ratio tends to be easily maintained.

[Energy Conversion Film]

A process (electretization process) for injecting a charge into the resin film or porous resin film as mentioned above is carried out to obtain an electret. In this manner, a charged resin film having charge within the film, i.e., an energy conversion film, can be obtained.

[Electretization]

As the electretization process, several processing methods can be mentioned. For example, a method of applying a DC high voltage or a pulsed high voltage while holding the two surfaces of a resin film by a conductor (electro-electretization method) and a electretization method by irradiating a resin film with γ ray and an electron beam (radio electretization method), are known.

Figure 3:
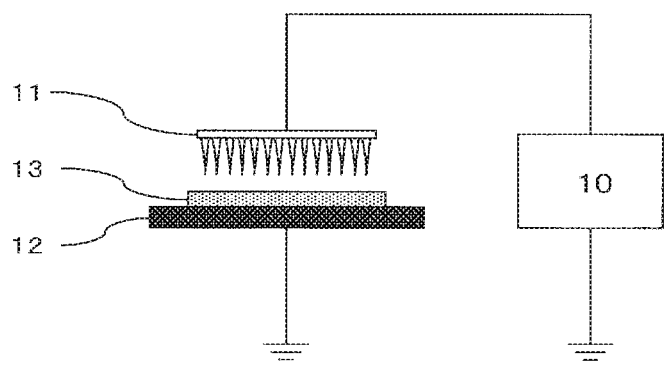
FIG. 3 is a schematic view of an example of an electretization device.

Of them, the electretization method (electro-electretization method) using a DC high voltage discharge is preferable. This is because the device is small; load given to an operator and an environment is low; and suitable for electretization of a polymer material such as a porous resin film As an example of the electretization device that can be used herein, an electretization device by DC high voltage discharge is shown in FIG. 3. As shown in FIG. 3, the electretization device is used for applying a predetermined voltage to a resin film 13, which is immobilized between a needle electrode 11 connected to a DC high voltage power supply 10 and a ground electrode 12. Owing to the electretization process by a DC high voltage discharge, a large amount of charge can be accumulated within the resin film 13

The application voltage during the electretization process can be varied depending on, e.g., the thickness and porosity of the resin film; the materials of the thermoplastic resin and pore-forming nucleating agent for use in a resin film; the processing speed; the shapes, quality of materials and size of the electrodes to be used; and the desired electric charge amount of the energy conversion film finally obtained, and appropriately determined in consideration of these. The application voltage, which is not particularly limited, is preferably 5 kV or more, more preferably 6 kV or more, and further preferably 7 kV or more. If so, a sufficient amount of charge can be injected and desirable piezoelectricity tends to be easily produced. In contrast, the application voltage of the electretization process is preferably 100 kV or less, more preferably 70 kV or less, and further preferably 50 kV or less. If so, a phenomenon where spark discharge locally occurs during an electretization process and a partial destruction such as pin holes occurs on the resin film during an electretization process; and a phenomenon where current flows from the surface of the resin film along the edge surface to the ground electrode, reducing the efficiency of the electretization process during an electretization process, tend to be easily avoided.

The temperature during the electretization process may be appropriately set. The process temperature, which is not particularly limited, is desirably not less than the glass transition temperature of a thermoplastic resin mainly used in the resin film to no more than the melting point of a crystal part thereof. If the process temperature is the glass transition temperature or more, movement of molecules in the amorphous part of the thermoplastic resin is activated and the molecules align suitably for a given charge, with the result that the electretization process can be carried out with high efficiency. If the process temperature is not less than the melting point of a metal soap, metal soap molecules align suitably for a given charge, with the result that the electretization process can be carried out with high efficiency. In contrast, if the process temperature exceeds the melting point of a thermoplastic resin mainly used in the resin film, the resin film itself cannot maintain its structure, with the result that it tends to be difficult to obtain a desired performance of the present invention.

In the electretization process, excessive charge is sometimes intentionally or unintentionally injected to a resin film. In this case, the energy conversion film discharges electricity after the process and sometimes causes an unfavorable problem in a post-treatment process. Thus, after the electretization, a process for eliminating excessive charge of the charged resin film may be carried out.

As such a charge elimination process, a method known in the art using a voltage application charge eliminator (ionizer) and a self-discharge charge eliminator can be employed. In the charge elimination process using these general charge eliminators, surface charge on the charged resin film can be removed; however, charge accumulated within the charged resin film, particularly in pores in the core layer, cannot be completely removed. Accordingly, performance of an electret material cannot be significantly lowered by the charge elimination process. Because of this, if excessive charge on the surface of the charged resin film is removed by such a charge elimination process, discharge phenomenon of the electret can be prevented.

[Energy Conversion Element]

An energy conversion element for use in input/output of power and electrical signals can be obtained by providing an electrode (described later) onto at least one of the two surfaces of the aforementioned energy conversion film. The energy conversion element preferably has the electrode on both the upper and lower surfaces of the energy conversion film in order to efficiently input/output electrical signals.

The timing for providing the electrode is not particularly limited. For example, the electrode may be provided on the resin film before an electretization process or a charged resin film (energy conversion film) after the electretization process. If the electrode is provided onto the energy conversion film after the electretization process, it is possible to prevent partial dissipation of injected charge via the electrode during the electretization process. However, in the following process for providing the electrode, if a load such as heat is applied to the charged resin film, part of injected charge dissipates and piezoelectricity may sometimes slightly deteriorate. In the circumstance, in consideration of the performance of the energy conversion element finally obtained, it is preferable that the electrode is previously provided on the resin film before an electretization process, and thereafter, the aforementioned electretization process is carried out.

[Electrode]

The energy conversion element that can input/output power can be obtained by providing the electrode onto at least one of the two surfaces of the energy conversion film obtained by electretization of a resin film. Usually, a pair of electrodes is provided on the two surfaces (upper surface and lower surface) of the energy conversion film. As the electrode, a thin film formed of a conductive material known in the art, such as metal particles, conductive metal oxide particle, carbon-based particles, or conductive resin, is mentioned. Also, as the electrode, a coating film obtained by printing or coating with a conductive coating material and a metallized film, can be mentioned.

Examples of the conductive material include mixtures obtained by adding particles of a metal such as gold, silver, platinum, copper, and silicon; particles of a conductive metal oxide such as a tin-doped indium oxide (ITO), an antimony-doped tin oxide (ATO), a fluorine-doped tin oxide (FTO), and an aluminum doped zinc oxide; or particles of carbon-based material such as graphite, carbon black, ketjen black, carbon nanofiller, and carbon nanotube, in a solution or dispersion solution of a binder resin component such as an acrylic resin, a urethane resin, an ether resin, an ester resin, an epoxy resin, a vinyl acetate resin, a vinyl chloride resin, a vinyl chloride-vinyl acetate copolymer, an amide resin, a melamine resin, a phenol resin, a vinyl alcohol resin, and a modified polyolefin resin. Also, the examples include a solution or a dispersion solution of conductive resin such as a polyaniline resin, a polypyrrole resin, and a polythiophene resin.

If the electrode is provided by printing using a conductive coating material as an ink, specific examples of the printing method include screen printing, flexographic printing, gravure printing, ink jet printing, relief printing, and offset printing. If the electrode is provided by applying a conductive coating material, specific examples of the coating applicator include a die coater, a bar coater, a comma coater, a rip coater, a roll coater, a curtain coater, a gravure coater, a spray coater, a blade coater, a reverse coater, and an air knife coater.

As a specific example of the metallized film, a metal thin film directly formed by vaporizing a metal such as aluminum, zinc, gold, silver, platinum, and nickel under reduced pressure and allowing the metal to vapor deposit on a surface of a resin film; or a metal thin film obtained by forming a metal thin film by vapor deposition of a metal, such as aluminum, zinc, gold, silver platinum, and nickel, on a carrier of, e.g., a polyethylene terephthalate (PET) film and transferring the metal thin film to a surface of a resin film, is mentioned.

The electrode may be provided by bonding a coating film or a metallized film of a conductive coating material, which is previously formed onto a dielectric film such as a polyethylene terephthalate film or a polypropylene film, to a resin film or an energy conversion film such that a conductive surface faces outside. Specific examples of the bonding method include methods known in the art such as a dry lamination method, a wet lamination method, and an extrusion lamination method.

The electrode, in order to easily input/output power, preferably has a surface resistivity of preferably $1\times10^{-3}\Omega/\square$ to $9\times10^{7}\Omega/\square$ and more preferably $1\times10^{-1}\Omega/\square$ to $9\times10^{4}\Omega/\square$, which is measured by a four-point probe array in accordance with "Testing method for resistivity of conductive plastics with a four-point probe array" defined by JIS K7194: 1994. If the resistance value of the electrode exceeds $9\times10^{7}\Omega/\square$, the transmission efficiency of electrical signals is low and performance as a material for an electrical/electronic input/output device tends to deteriorate. In contrast, if an electrode having the resistance value of less than $1\times10^{-3}\Omega/\square$ is provided by coating, a thick electrode must be formed. If not, pores of a porous resin film may collapse by heat during a dry process or during sintering performed after coating and/or the resin film may be deformed by heat shrinkage. When the electrode is provided by metal vapor deposition, the resin film may be similarly deformed by heat of a metal to be vapor deposited.

The thickness of the electrode, which is not particularly limited; is preferably 0.1 µm or more, more preferably 1 µm or more, and further preferably 5 µm or more. The thickness of the electrode is preferably 200 µm or less, more preferably 50 µm or less, and further preferably 20 µm or less.

[Thickness of Resin Film]

In the specification, the thickness of the resin film is defined as the total thickness value of the film measured by a thickness gauge based on the JIS K7130: 1999 "Plastics—film and sheeting—determination of thickness". If the resin film has a multilayer structure, the thicknesses of individual layers constituting the multilayer are defined as values, which are obtained by cooling a measurement sample up to a temperature of −60° C. or less with liquid nitrogen and placing it on a glass plate; placing a razor blade on the sample at a right angle; cutting the sample to prepare a sectional measurement sample; observing the sectional measurement sample by a scanning electron microscope; determining the border line between the individual layers based on the shape of pores and the appearance; obtaining the thicknesses of the layers from an observation image; determining the ratios of the thicknesses of the layers occupied in the total resin film thickness; and multiplying the total thickness of the film obtained by the thickness gauge by the above ratio.

[Surface Resistivity of Resin Film]

In the specification, the surface resistivity of a resin film is defined as a value calculated from the surface resistivity, which is measured under a temperature of 23° C. and a relative humidity of 50% in accordance with JIS K6911: 1995, "Testing methods for thermosetting plastics" by using an electrode of a double-ring method, based on the following formula 2.

[Expression 2]

$$\text{Surface resistivity } (\Omega/\square) = RS \times \pi \times (D+d)/(D-d) \quad \text{(Expression 2)}$$

RS: Surface resistance
π: Circumference ratio
d: Outer diameter of inner circle of surface electrode (cm)
D: Inner diameter of surface circular electrode (cm)

The resin film has preferably insulation properties. The surface resistivity of at least one of the two surfaces is preferably $1 \times 10^{13} \Omega/\square$ or more and more preferably $5 \times 10^{13} \Omega/\square$ or more. If so, charge injected when an electretization process is applied rarely travels away from the surface and efficient charge injection is easily carried out. In contrast, in the resin film, the surface resistance of at least one of the surfaces is preferably $9 \times 10^{17} \Omega/\square$ or less and more preferably $5 \times 10^{16} \Omega/\square$ or less. If so, adhesion of dust and the like to the resin film can be prevented and a phenomenon where local electric discharge occurs through dust and the like during an electretization process, suppressing efficient electretization, can be easily suppressed.

[Surface Resistivity of Electrode]

In the specification, the surface resistivity of the electrode is defined as a value calculated from a resistance value measured by a four-point probe array in accordance with "Testing method for resistivity of conductive plastics with a four-point probe array" defined by JIS K7194: 1994, based on the following Expression 3.

[Expression 3]

$$\text{Surface resistivity } (\Omega/\square) = F \times R \quad \text{(Expression 3)}$$

F: Correction coefficient (described in JIS K7194)
R: Resistance value

[Areas of Energy Conversion Film and Energy Conversion Element as Viewed in a Plan View]

Since the energy conversion film of the present invention and the energy conversion element thereof employ a charged resin film as mentioned above, they are relatively inexpensive, different from a semiconductor material conventionally and ordinarily used as a material for electrical-mechanical energy conversion. Because of this, the areas of them in a plan view can be easily increased up to, for example, about 10 to 50,000 cm². If large-area energy conversion film and energy conversion element are formed, the areas of them in the plan view are appropriately determined in consideration of a desired performance and physical limitation such as an installation site. The area, which is not particularly limited, is preferably 20 to 30,000 cm² and more preferably 50 to 25,000 cm².

[Maximum Voltage]

In the energy conversion element, a voltage is generated by impact given after heat treatment. The maximum voltage (in average) is preferably 5 mV or more, more preferably 10 mV or more, further preferably 20 mV or more, and particularly preferably 30 mV or more, from the viewpoint of practical performance of the energy conversion element. The upper limit, which is not particularly limited, is preferably 300 mV or less, more preferably 200 mV or less, further preferably 100 mV or more and particularly preferably 50 mV or less. In the specification, before a maximum voltage is measured, a heat treatment is carried out by storing the energy conversion element in the conditions of 85° C. for 14 days. The maximum voltage is defined as a value obtained by measuring a maximum voltage generated by impact given by naturally dropping an iron ball having a diameter of 9.5 mm and a mass 3.5 g form a height of 8 mm in the vertical direction onto the energy conversion element horizontally placed in the environment of a temperature 23° C. and a relative humidity of 50%, repeating the process 10 times, and calculating an average of the values.

EXAMPLES

The present invention will be more specifically described by way of the following Production Examples, Examples, Comparative Examples, and Experimental Examples. The materials, use amounts, ratios, operations, etc., described below can be appropriately changed as long as they do not deviate from the spirit of the present invention. Accordingly, the range of the present invention is not limited to examples shown below. Note that, the symbol "%" used below, represents mass % unless otherwise specified.

Preparation Example of Resin Composition

The thermoplastic resin (propylene homopolymer and high density polyethylene), metal soap, heat stabilizer, and pore-forming nucleating agent (heavy calcium carbonate powder) shown in Table 1 were mixed in accordance with the blending ratio (unit: mass %) shown in Table 1, melt-kneaded by a twin screw kneader set at 210° C., extruded in the form of strand by an extruder set at 230° C., cooled, and cut by a strand cutter. In this manner, pellets of resin compositions a to h, j, k, and m to r were prepared.

TABLE 1

| | Name of material | a | b | c | d | e | f | g | h | j | k | m | n | o | p | q | r |
|---|---|---|---|---|---|---|---|---|---|---|---|---|---|---|---|---|---|
| Thermoplastic resin | Propylene homopolymer (trade name: NOVATEC-PP, FY6Q, manufactured by Japan Polypropylene Corporation, MFR (230° C., 2.16 kg), 2.4 g/10 minutes, melting point: 164° C., density: 0.91 g/cm³, containing no additives) | 99.9 | 71.85 | 71.7 | 71.4 | 70.9 | 66.9 | 71.4 | 71.4 | 71.4 | 71.4 | 71.4 | 74.7 | 62.4 | 71.9 | 71.89 | 71.7 |
| | High density polyethylene (trade name: NOVATEC HD, HJ 360, manufactured by Japan Polyethylene Corporation, MFR (230° C., 2.16 kg), 5.5 g/10 minutes, melting point: 131° C., density: 0.95 g/cm³) | 0 | 10 | 10 | 10 | 10 | 10 | 10 | 10 | 10 | 10 | 10 | 10 | 12 | 10 | 10 | 10 |
| Metal soap | Dihydroxyaluminum octadecanoate (manufactured by Wako Pure Chemical Industries Ltd., reagent, melting point: 172° C.) | 0 | 0.05 | 0.2 | 0.5 | 1 | 5 | 0 | 0 | 0 | 0 | 0 | 0.2 | 0.5 | 0 | 0.01 | 0 |
| | Hydroxyaluminum dioctadecanoate (manufactured by Wako Pure Chemical Industries Ltd., reagent, melting point: 150° C.) | 0 | 0 | 0 | 0 | 0 | 0 | 0.5 | 0 | 0 | 0 | 0 | 0 | 0 | 0 | 0 | 0 |
| | Aluminum trioctadecanoate (manufactured by KANTO CHEMICAL CO., INC., reagent, melting point: 103° C.) | 0 | 0 | 0 | 0 | 0 | 0 | 0 | 0.5 | 0 | 0 | 0 | 0 | 0 | 0 | 0 | 0 |
| | Dihydroxyaluminum dodecanoate (manufactured by Nitto Chemical Industry Co., Ltd., trade name: AS-3, melting point: 191° C.) | 0 | 0 | 0 | 0 | 0 | 0 | 0 | 0 | 0.5 | 0 | 0 | 0 | 0 | 0 | 0 | 0 |
| | Calcium dioctadecanoate (manufactured by Wako Pure Chemical Industries Ltd., reagent, melting point: 180° C.) | 0 | 0 | 0 | 0 | 0 | 0 | 0 | 0 | 0 | 0.5 | 0 | 0 | 0 | 0 | 0 | 0 |
| | Zinc dioctadecanoate (manufactured by Wako Pure Chemical Industries Ltd., reagent, melting point: 128° C.) | 0 | 0 | 0 | 0 | 0 | 0 | 0 | 0 | 0 | 0 | 0.5 | 0 | 0 | 0 | 0 | 0 |
| | Sodium dioctadecanoate (manufactured by Wako Pure Chemical Industries Ltd., reagent, melting point: 225° C.) | 0 | 0 | 0 | 0 | 0 | 0 | 0 | 0 | 0 | 0 | 0 | 0 | 0 | 0 | 0 | 0.2 |
| Heat stabilizer | Sterically hindered phenol stabilizer (trade name: IRGANOX 1010, manufactured by BASF, melting point: 110 to 125° C.) | 0.05 | 0.05 | 0.05 | 0.05 | 0.05 | 0.05 | 0.05 | 0.05 | 0.05 | 0.05 | 0.05 | 0.05 | 0.05 | 0.05 | 0.05 | 0.05 |
| | Phosphorus stabilizer (trade name: IRGAFOS 168, manufactured by BASF, melting point: 183 to 186° C.) | 0.05 | 0.05 | 0.05 | 0.05 | 0.05 | 0.05 | 0.05 | 0.05 | 0.05 | 0.05 | 0.05 | 0.05 | 0.05 | 0.05 | 0.05 | 0.05 |
| Pore-forming nucleating agent | Heavy calcium carbonate powder (trade name: BF100, manufactured by Bihoku Funka Kogyo Co., Ltd., median diameter D₅₀: 10.1 μm, density: 2.7 g/cm³) | 0 | 18 | 18 | 18 | 18 | 18 | 18 | 18 | 18 | 18 | 18 | 15 | 25 | 18 | 18 | 18 |

Production Examples 1 to 14 and 16

The resin composition for the upper skin layer, the resin composition for the core layer, and the resin composition for the lower skin layer described in Table 2 were separately melt-kneaded by three extruders set at 230° C., and then, supplied to a feed-block type multilayer die set at 250° C., stacked within the die in the order described in Table 2, extruded in the form of a sheet, and cooled in a cooling device to 60° C. to obtain a three-layer structure unstretched sheet.

The unstretched sheet obtained was heated by a heating roll to the temperature of the "longitudinal direction" shown in Table 2, and stretched in the longitudinal direction (MD direction) by using difference in peripheral speed of rolls at the stretch ratio of the "longitudinal direction" shown in Table 2 to obtain a uniaxially stretched sheet. Then, the uniaxially stretched sheet thus obtained was cooled to 60° C., heated again in an oven to the temperature of the "lateral direction" shown in Table 2, stretched in the lateral direction (TD direction) by using a tenter at the stretch ratio of the "lateral direction" shown in Table 2, and further heated in the oven to 160° C. In this way, an anneal process is applied to obtain a biaxially stretched sheet.

The biaxially stretched sheet thus obtained was cooled to 60° C. and a slit is made in ear portions thereof. A corona surface discharge treatment was applied to the two surfaces of the sheet. In this manner, resin films (porous resin films having pores within the film) according to Production Examples 1 to 14 and 16 shown in Table 2 and having physical properties shown in Table 2, were obtained. The surface resistivity of the resultant resin films at both upper and lower surfaces were all $10^{14} \Omega/\square$ or more.

Production Example 15

The two surfaces of the resin film obtained in Production Example 3 were coated with an anchor coating agent, i.e., a solution prepared by diluting i.e., a solution of an epichlorohydrin adduct of polyamine polyamide (trade name: WS4024, manufactured by SEIKO PMC CORPORATION, solid-content concentration: 25 mass %) 25 fold with a mixture of water/2-propanol=9/1, by use of a squeeze coater such that the coating amount of a dried film was both 0.02 g/m², and dried in an oven of 80° C. to form an anchor coat layer. In this manner, the resin film of Production Example 15 was obtained. The surface resistivity of the resultant resin film at the upper and lower surfaces both were in the order of $10^{14} \Omega/\square$.

Production Example 17

The resin film of Production Example 17 was obtained in accordance with a method for producing a synthetic resin foamed sheet (Example 3) described in paragraphs 0051 to 0053 of Japanese Patent Laid-Open No. 2014-074104. The surface resistivity of the resultant resin film at the upper and lower surfaces both were in the order of $10^{14} \Omega/\square$.

Examples 1 to 12, 17, and 18, Comparative Examples 1 and 2

To a PET film (trade name: E5200, manufactured by Toyobo Co., Ltd.) having a thickness of 12 μm, aluminum was vapor deposited so as to obtain a vapor deposition film having a thickness of 30 nm by use of a vapor deposition roll-to-roll vacuum deposition apparatus, in a vacuum condition of $1 \times 10^{-2}$ Pa to obtain a metallized film having a surface resistivity of the vapor deposition surface of 1/OD.

Subsequently, a polyether adhesive (trade name: TM-317, manufactured by Toyo-Morton, Ltd.) and an isocyanate curing agent (trade name: CAT-11B, manufactured by Toyo-Morton, Ltd.) were mixed in a mass ratio of 50:50 and diluted with ethyl acetate to obtain an adhesive coating material having a solid-content concentration of 25%.

Subsequently, the metallized film obtained above was cut into square pieces of 10 cm long×10 cm wide. The whole surface of the pieces having no metal deposited was coated with the adhesive coating material such that the thickness of the coating film dried becomes 2 μm, by use of a bar coater, and dried in an oven of 40° C. for one minute to provide an adhesive layer on the surface of the metallized film.

The resin films obtained in Production Examples 1 to 14, 16, and 17 were each cut into square pieces of 20 cm long×20 cm wide. To the center of each of the upper and lower surfaces of the cut film pieces, a metallized film was bonded with the adhesive layer interposed between them

TABLE 2

| | | Resin composition | | | Stretch condition | | | | | Physical property | |
|---|---|---|---|---|---|---|---|---|---|---|---|
| | | | | | Longitudinal direction | | Lateral direction | | | Thickness (thickness of | |
| | | Upper skin layer | Core layer | Lower skin layer | Temperature (° C.) | Stretch ratio (fold) | Temperature (° C.) | Stretch ratio (fold) | Axial stretching for each layer | individual layers) (μm) | Porosity (%) |
| Production Example | 1 | a | b | a | 135 | 5 | 155 | 9 | Biaxial/Biaxial/Biaxial | 70 (1/68/1) | 50 |
| | 2 | ↓ | c | ↓ | ↓ | ↓ | ↓ | ↓ | ↓ | ↓ | ↓ |
| | 3 | ↓ | d | ↓ | ↓ | ↓ | ↓ | ↓ | ↓ | ↓ | ↓ |
| | 4 | ↓ | e | ↓ | ↓ | ↓ | ↓ | ↓ | ↓ | ↓ | ↓ |
| | 5 | ↓ | f | ↓ | ↓ | ↓ | ↓ | ↓ | ↓ | ↓ | ↓ |
| | 6 | ↓ | g | ↓ | ↓ | ↓ | ↓ | ↓ | ↓ | ↓ | ↓ |
| | 7 | ↓ | h | ↓ | ↓ | ↓ | ↓ | ↓ | ↓ | ↓ | ↓ |
| | 8 | ↓ | j | ↓ | ↓ | ↓ | ↓ | ↓ | ↓ | ↓ | ↓ |
| | 9 | ↓ | k | ↓ | ↓ | ↓ | ↓ | ↓ | ↓ | ↓ | ↓ |
| | 10 | ↓ | m | ↓ | ↓ | ↓ | ↓ | ↓ | ↓ | ↓ | ↓ |
| | 11 | ↓ | n | ↓ | 140 | ↓ | ↓ | 8 | ↓ | 50 (2/46/2) | 35 |
| | 12 | ↓ | o | ↓ | 135 | ↓ | ↓ | 9 | ↓ | 100 (2/96/2) | 65 |
| | 13 | ↓ | p | ↓ | 135 | ↓ | ↓ | ↓ | ↓ | 70 (1/68/1) | 50 |
| | 14 | ↓ | q | ↓ | ↓ | ↓ | ↓ | ↓ | ↓ | ↓ | ↓ |
| | 16 | ↓ | r | ↓ | ↓ | ↓ | ↓ | ↓ | ↓ | ↓ | ↓ | such that the vapor deposition film was positioned as the outermost layer. The pieces were placed in an oven of 40° C. for 24 hours to cure the adhesive to obtain a resin film having an electrode at both surfaces.

The resultant resin film having an electrode at both surfaces was set on the board of the ground electrode 12 of the electretization device shown in FIG. 3, in which the inter-needle distance of a needle electrode was set to be 10 mm and the distance between the needle electrode and the ground electrode was set to be 10 mm, such that the upper surface of the resin film on the board faced the main electrode. Then, a DC voltage of −10 KV was applied to the needle electrode for 5 seconds. In this manner, electretization was carried out to obtain the energy conversion films of Examples 1 to 12, 17, and 18 and Comparative Examples 1 and 2 shown in Table 3 and the energy conversion elements of Examples 1 to 12, 17, and 18 and Comparative Examples 1 and 2.

Example 13

To a PET film (trade name: E5200, manufactured by Toyobo Co., Ltd.) having a thickness of 12 μm, aluminum was vapor deposited so as to obtain a vapor deposition film having a thickness of 30 nm, by use of a vapor deposition roll-to-roll vacuum deposition apparatus in a vacuum condition of $1\times10^{-2}$ Pa to obtain a metallized film having a surface resistivity of the vapor deposition surface of 1Ω/□.

Subsequently, a polyether adhesive (trade name: TM-317, manufactured by Toyo-Morton, Ltd.) and an isocyanate curing agent (trade name: CAT-11B, manufactured by Toyo-Morton, Ltd.) were mixed in a mass ratio of 50:50 and diluted with ethyl acetate to obtain adhesive coating material having a solid-content concentration of 25%.

Subsequently, the metallized film obtained above was cut into square pieces of 10 cm long×10 cm wide. The whole surface of the pieces having no metal deposited was coated with the adhesive coating material such that the thickness of the coating film dried becomes 2 μm, by use of a bar coater, and dried in an oven of 40° C. for one minute to provide an adhesive layer on the surface of the metallized film.

The resin film obtained in Production Example 15 was cut into square pieces of 20 cm long×20 cm wide. To the center of each of the lower surfaces of the cut film pieces, a metallized film was bonded with the adhesive layer interposed between them such that the vapor deposition film was positioned as the outermost layer.

Subsequently, aluminum foil (trade name: My foil, manufactured UACJ Foil Corporation, surface resistivity: $3\times10^{-3}$Ω/□) having a thickness 12 μm was cut into square pieces 10 cm long×10 cm wide. The whole surface of each of the pieces low in glossiness was coated with the adhesive coating material such that the thickness of the coating film dried becomes 2 μm, by use of a bar coater and dried in an oven of 40° C. for one minute. Thereafter, the aluminum piece was bonded to the center portion of the surface of the cut-film piece having the metallized film bonded thereto. The resultant pieces were placed in an oven of 40° C. for 24 hours to cure the adhesive to obtain a resin film having an electrode at both surfaces.

The resultant resin film having the electrode at both surfaces was set on the board of the ground electrode 12 of the electretization device shown in FIG. 3, in which the inter-needle distance of a needle electrode was set to be 10 mm and the distance between the needle electrode and the ground electrode was set to be 10 mm, such that the upper surface of the resin film on the board faced the main electrode. Then, a DC voltage of −10 KV was applied to the needle electrode for 5 seconds. In this manner, electretization was carried out to obtain the energy conversion film of Example 13 and the energy conversion element of Example 13.

Example 14

The resin film obtained in Production Example 15 was cut into square pieces of 20 cm long×20 cm wide. To the center of the lower surface of each of the cut film pieces, a solid square of 10 cm long×10 cm wide was printed with silver ink (trade name: DOTITE D-500, manufactured by Fujikura Kasei Co., Ltd., solid-content concentration: 77 mass %) by use of a multi-purpose printing testing machine (trade name: K303 multi coater, manufactured by RK PrintCoat Instruments Ltd.) and a gravure plate of 400 lines (per inch). The cut film pieces were dried in an oven of 80° C. for one hour. Thereafter, at the center portion of the upper surface of each of the cut film pieces, a solid square of 10 cm long×10 cm wide was printed with the silver ink by use of the multi-purpose printing testing machine and the gravure plate such that the printing positions of the upper and lower surfaces were mutually matched. The cut film pieces were dried in an oven of 80° C. for 24 hours to obtain resin films having an electrode at both surfaces. The resultant electrodes on the upper and lower surfaces both had a thickness of 2 μm and a surface resistivity of 1Ω/□.

The resultant resin film having an electrode at both surfaces was set on the board of the ground electrode 12 of the electretization device shown in FIG. 3, in which the inter-needle distance of a needle electrode was set to be 10 mm and the distance between the needle electrode and the ground electrode was set to be 10 mm, such that the upper surface of the resin film on the board faced the main electrode. Then, a DC voltage of −10 KV was applied to the needle electrode for 5 seconds. In this manner, electretization was carried out to obtain the energy conversion films of Example 14 and the energy conversion elements of Example 14.

Example 15

The resin film obtained in Production Example 15 was cut into square pieces of 20 cm long×20 cm wide. To the center of the lower surface of each of the cut film pieces, a solid square of 10 cm long×10 cm wide was printed with carbon ink (trade name: DOTITE XC-3050, manufactured by Fujikura Kasei Co., Ltd., solid-content concentration: 50 mass %) by use of a screen printing machine (trade name: SSA-TF150E, manufactured by SERIA CORPORATION) and a screen plate of 200 lines (per inch). The cut film pieces were dried in an oven of 80° C. for one hour. Thereafter, at the center portion of the upper surface of each of the cut film pieces, a solid square of 10 cm long×10 cm wide was printed with the carbon ink by use of the screen printing machine and the screen plate such that the printing positions of the upper and lower surfaces were mutually matched. The cut film pieces were dried in an oven of 80° C. for 24 hours to obtain resin films having an electrode at two surfaces. The resultant electrodes on the upper and lower surfaces both had a thickness of 10 μm and a surface resistivity of 120Ω/□.

The resultant resin film having an electrode at both surfaces was set on the board of the ground electrode 12 of the electretization device shown in FIG. 3, in which the inter-needle distance of a needle electrode was set to be 10 mm and the distance between the needle electrode and the ground electrode was set to be 10 mm, such that the upper surface of the resin film on the board faced the main electrode. Then, a DC voltage of −10 KV was applied to the needle electrode for 0.5 seconds. In this manner, electretization was carried out to obtain the energy conversion films of Example 15 and the energy conversion elements of Example 15.

Example 16

The resin film obtained in Production Example 15 was cut into square pieces of 20 cm long×20 cm wide. To the center of the lower surface of each of the cut film pieces, a solid square of 10 cm long×10 cm wide was printed with polythiophene ink (trade name: Orgacon ICP1050, manufactured by Agfa-Gevaert Group, solid-content concentration: 1.1 mass %) by use of a multi-purpose printing machine (trade name: K303 multi coater, manufactured by RK PrintCoat Instruments Ltd.) and a gravure plate of 100 lines (per inch). The cut film pieces were dried in an oven of 80° C. for one hour. Thereafter, at the center portion of the upper surface of each of the cut film pieces, a solid square of 10 cm long×10 cm wide was printed with the polythiophene ink by use of the multi-purpose printing testing machine and the gravure plate such that the printing positions of the upper and lower surfaces were mutually matched. The cut film pieces were dried in an oven of 80° C. for 24 hours to obtain resin films having an electrode at both surfaces. The resultant electrodes on the upper and lower surfaces both had a thickness of 0.2 μm and a surface resistivity of $4 \times 10^4 \Omega/\square$.

The resultant resin film having an electrode at both surfaces was set on the board of the ground electrode 12 of the electretization device shown in FIG. 3, in which the inter-needle distance of a needle electrode was set to be 10 mm and the distance between the needle electrode and the ground electrode was set to be 10 mm, such that the upper surface of the resin film on the board faced the main electrode. Then, a DC voltage of −10 KV was applied to the needle electrode for 5 seconds. In this manner, electretization was carried out to obtain the energy conversion films of Example 16 and the energy conversion elements of Example 16.

Experimental Example

From each of the energy conversion elements obtained in Examples 1 to 17 and Comparative Example 1, a portion having an electrode was cut out to individually prepare samples having 10 cm long×10 cm wide.

Using individual samples, a maximum voltage was measured by the following method.

Subsequently, the samples prepared in the same manner as above were subjected to a heat treatment in an oven set at 85° C. in severe conditions for 14 days. Using the samples treated with heat, a maximum voltage was measured by the following manner. The heat treatment herein, different from the aforementioned heat treatment, is carried out in order to evaluate the heat resistance of the energy conversion elements obtained and the purpose of the heat treatment is acceleration under a high temperature environment.

[Maximum Voltage]

Figure 4:
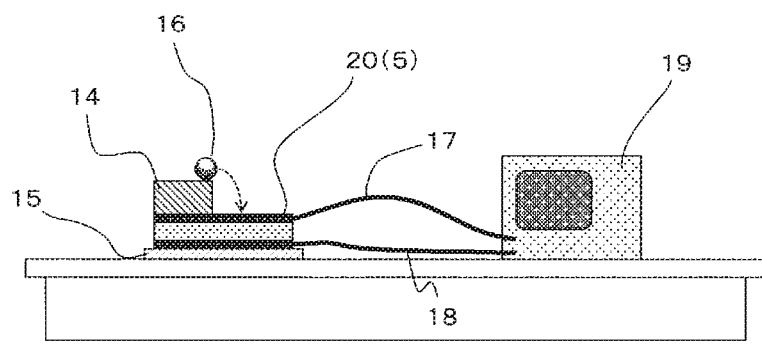
FIG. 4 is a schematic view of a falling ball test apparatus used in the Experimental Example of the present invention.

Using the falling ball test apparatus shown in FIG. 4, a maximum voltage was measured at a temperature of 23° C. under a relative humidity 50% environment. Herein, first, one ends of lead wires 17 and 18 were bonded respectively to the electrodes formed on the upper and lower surfaces of a sample 20 (energy conversion film 5) of 10 cm long×10 cm wide, with a conductive tape (trade name: AL-25BT, manufactured by Sumitomo 3M); and the other ends of lead wires 17 and 18 were connected to a high speed recorder 19 (trade name: GR-7000, manufactured by KEYENCE CORPORATION). On the insulating sheet 15 (soft vinyl chloride sheet, thickness: 1 mm) of the falling ball test apparatus shown in FIG. 4, the sample 20 was placed such that the upper surface faced above, and then, a glass plate 14 (thickness: 8 mm) was placed on the upper surface of the sample 20, and further, an iron ball 16 having a diameter 9.5 mm and a, mass 3.5 g was placed on the glass plate 14.

Subsequently, the iron ball 16 was allowed to naturally drop from the glass plate 14 placed at a height (in the vertical direction) of 8 mm on the sample 20 and the voltage signal from the sample 20 was sent to the high speed recorder 19. The maximum voltage generated by impact with a falling ball was measured 10 times and the maximum voltage values were averaged.

[Retention Rate after Heat Treatment]

The ratio of the maximum voltage (in average) before and after the heat treatment calculated by the aforementioned method was obtained by percentage and regarded as the retention rate after the heat treatment. The retention rates after the heat treatment are shown in Table 3. In view of heat resistance, the retention rate after the heat treatment is preferably 1% or more, more preferably 2% or more, further preferably 3% or more, and particularly preferably 5% or more.

From the data of the retention rate after the heat treatment shown in Table 3, it was supported that, in the energy conversion film of the present invention and the energy conversion element thereof, even if they were treated with heat under severe conditions, the retention rate of generated voltage was about 140 to 800% of those of Comparative Examples, and that, further in preferable embodiments, the film and element exerted a particularly remarkable effect that cannot be exerted by conventional products. From this, it is presumed that the retention rate of the generated voltage of the product of the present invention at normal temperature and a high temperature of 40 to 60° C. (milder use conditions) is considerably higher than that of conventional products.

TABLE 3

| | Production Example | Energy conversion film - Metal soap Type | Addition amount (mass %) Resin film basis | Resin composition basis | Thermoplastic resin basis | Electrode Upper surface Material | Thickness (μm) | Surface resistivity (Ω/□) | Electrode Lower surface Material | Thickness (μm) | Surface resistivity (Ω/□) | Maximum voltage (mV) Before heat treatment | After heat treatment | Retention rate after heat treatment (%) |
|---|---|---|---|---|---|---|---|---|---|---|---|---|---|---|
| Example 1 | Production Example 1 | Dihydroxyaluminum octadecanoate | 0.05 | 0.05 | 0.06 | Deposition film | 12 | $1 \times 10^0$ | Deposition film | 12 | $1 \times 10^0$ | 580 | 14 | 2.4 |
| 2 | Production Example 2 | → | 0.19 | 0.2 | 0.24 | → | → | → | → | → | → | 550 | 33 | 6.0 |
| 3 | Production Example 3 | → | 0.47 | 0.5 | 0.61 | → | → | → | → | → | → | 580 | 36 | 6.2 |
| 4 | Production Example 4 | → | 0.95 | 1 | 1.22 | → | → | → | → | → | → | 540 | 15 | 2.8 |
| 5 | Production Example 5 | → | 4.75 | 5 | 6.10 | → | → | → | → | → | → | 550 | 13 | 2.4 |
| 6 | Production Example 6 | Hydroxyaluminum dioctadecanoate | 0.47 | 0.5 | 0.61 | → | → | → | → | → | → | 580 | 32 | 5.5 |
| 7 | Production Example 7 | Aluminum trioctadecanoate | → | → | → | → | → | → | → | → | → | 590 | 34 | 5.8 |
| 8 | Production Example 8 | Dihydroxyaluminum dodecanoate | → | → | → | → | → | → | → | → | → | 560 | 34 | 6.1 |
| 9 | Production Example 9 | Calcium dioctadecanoate | → | → | → | → | → | → | → | → | → | 560 | 18 | 3.2 |
| 10 | Production Example 10 | Zinc dioctadecanoate | → | → | → | → | → | → | → | → | → | 570 | 17 | 3.0 |
| 11 | Production Example 11 | Dihydroxyaluminum octadecanoate | 0.18 | 0.2 | 0.24 | → | → | → | → | → | → | 520 | 41 | 7.9 |
| 12 | Production Example 12 | → | 0.45 | 0.5 | 0.67 | → | → | → | → | → | → | 650 | 25 | 3.8 |
| 13 | Production Example 13 | → | 0.47 | 0.5 | 0.61 | Aluminum foil | → | $3 \times 10^{-3}$ | → | → | → | 500 | 32 | 6.4 |
| 14 | → | → | → | → | → | Silver ink | 2 | $1 \times 10^0$ | Silver ink | 2 | $1 \times 10^0$ | 580 | 31 | 5.3 |
| 15 | → | → | → | → | → | Carbon ink | 10 | $1 \times 10^2$ | Carbon ink | 10 | $1 \times 10^2$ | 570 | 45 | 7.9 |
| 16 | → | → | → | → | → | Polythiophene ink | 0.2 | $4 \times 10^4$ | Polythiophene ink | 0.2 | $4 \times 10^4$ | 550 | 35 | 6.4 |

TABLE 3-continued

| | | Energy conversion film | | | | | Electrode | | | | | | Experimental Example | | |
|---|---|---|---|---|---|---|---|---|---|---|---|---|---|---|---|
| | | Metal soap | | | | | Upper surface | | | Lower surface | | | Maximum voltage (mV) | | Retention rate after heat treatment (%) |
| | | | | Addition amount (mass %) | | | | | | | | | | | |
| | Production Example | Type | Resin film basis | Resin composition basis | Thermoplastic resin basis | Material | Thickness (μm) | Surface resistivity (Ω□) | Material | Thickness (μm) | Surface resistivity (Ω□) | Before heat treatment | After heat treatment | |
| Comparative Example 1 | Production Example 13 | None | 0 | 0 | 0 | Deposition film | 12 | $1 \times 10^0$ | Deposition film | 12 | $1 \times 10^0$ | 560 | 4 | 0.7 |
| Example 17 | Production Example 14 | Dihydroxyaluminum octadecanoate | 0.01 | 0.01 | 0.01 | → | → | → | → | → | → | 580 | 6 | 1.0 |
| Example 18 | Production Example 16 | Sodium octadecanoate | 0.19 | 0.2 | 0.24 | → | → | → | → | → | → | 590 | 10 | 1.7 |
| Comparative Example 2 | Production Example 17 | Mixture of aluminum 3,5-di-tetra-butylsalicylate and benzyl tributyl ammonium 4-hydroxynaphthalene-1-sulfonate (1:1) | 0.095 | 0.1 | 0.122 | → | → | → | → | → | → | 550 | 3 | 0.5 |

INDUSTRIAL APPLICABILITY

The energy conversion film of the present invention and the energy conversion element thereof exert piezoelectricity at a higher temperature than a phase transition temperature of a material for the energy conversion film, and a reduction of piezoelectricity thereof is low even if the film and the element are exposed to a high temperature environment. From this, the energy conversion film of the present invention and the energy conversion element thereof can be widely and efficiently used as a module member for electrical-mechanical energy conversion that may be possibly used at high temperature conditions, such as a speaker, a headphone, a microphone, an ultrasonic sensor, a pressure sensor, an acceleration sensor, and a vibration control device; and particularly as a module member of sensors such as an acoustic sensor, a vibration sensor, and a shock sensor. Thus, the present invention can be widely used as devices or systems to which these sensors are installed, such as a measuring device, a control device, an abnormality diagnosis system, a security device, a stabilizer, a robot, a percussion instrument, a game machine, and a power generator, and provides tremendous contribution to these industry fields.

REFERENCE SIGNS LIST

1 Energy conversion film
2 Resin film (core layer)
3 Upper surface skin layer
4 Lower surface skin layer
5 Energy conversion element
6 Upper electrode
7 Lower electrode
10 DC high voltage power supply
11 Needle electrode
12 Ground electrode
13 Resin film or resin film with electrode
14 Glass plate
15 Insulating sheet
16 Iron ball
17 Lead wire
18 Lead wire
19 High speed recorder
20 Sample (energy conversion element)

The invention claimed is:

1. An energy conversion element comprising:
an energy conversion film at least comprising a charged resin film consisting of a resin film at least containing a thermoplastic resin and a metal soap; and
an electrode provided on at least one of two surfaces of the energy conversion film, wherein
the metal soap is a salt of a fatty acid having 5 to 30 carbon atoms and aluminum;
the resin film is a porous resin film having pores within the film;
the porous resin film is a multilayer resin film comprising a core layer and a skin layer;
the core layer comprises at least the thermoplastic resin, the metal soap, and a pore-forming nucleating agent; and
the porous resin film has a porosity of 20% to 80%.

2. The energy conversion element according to claim 1, wherein the thermoplastic resin contains a polyolefin resin, and the metal soap has a melting point of 50° C. to 220° C.

3. The energy conversion element according to claim 1, wherein the energy conversion film at least comprises a charged resin film obtained by injecting a charge into the resin film by a DC corona discharge processing.

4. The energy conversion element according to claim 1, wherein the electrode has a surface resistivity of $1\times10^{-3}\Omega/\square$ to $9\times10^{7}\Omega/\square$.

5. The energy conversion element according to claim 1, wherein a maximum voltage, which is generated by an impact when an iron ball having a diameter of 9.5 mm and a mass of 3.5 g is naturally dropped from a height of 8 mm in the vertical direction on the energy conversion element, which has been subjected to a heat treatment at 85° C. for 14 days and placed on a horizontal plane at a temperature of 23° C. in an environment of a relative humidity of 50%, is 5 mV or more.

6. An energy conversion film at least comprising a charged resin film consisting of a resin film at least containing a thermoplastic resin and a metal soap, wherein
the metal soap is a salt of a fatty acid having 5 to 30 carbon atoms and aluminum;
the resin film is a porous resin film having pores within the film;
the porous resin film is a multilayer resin film comprising a core layer and a skin layer;
the core layer comprises at least the thermoplastic resin, the metal soap, and a pore-forming nucleating agent; and
the porous resin film has a porosity of 20% to 80%.

7. The energy conversion element according to claim 2, wherein the energy conversion film at least comprises a charged resin film obtained by injecting a charge into the resin film by a DC corona discharge processing.

8. The energy conversion element according to claim 2, wherein the electrode has a surface resistivity of $1\times10^{-3}\Omega/\square$ to $9\times10^{7}\Omega/\square$.

9. The energy conversion element according to claim 3, wherein the electrode has a surface resistivity of $1\times10^{-3}\Omega/\square$ to $9\times10^{7}\Omega/\square$.

10. The energy conversion element according to claim 7, wherein the electrode has a surface resistivity of $1\times10^{-3}\Omega/\square$ to $9\times10^{7}\Omega/\square$.

11. The energy conversion element according to claim 2, wherein a maximum voltage, which is generated by an impact when an iron ball having a diameter of 9.5 mm and a mass of 3.5 g is naturally dropped from a height of 8 mm in the vertical direction on the energy conversion element, which has been subjected to a heat treatment at 85° C. for 14 days and placed on a horizontal plane at a temperature of 23° C. in an environment of a relative humidity of 50%, is 5 mV or more.

12. The energy conversion element according to claim 3, wherein a maximum voltage, which is generated by an impact when an iron ball having a diameter of 9.5 mm and a mass of 3.5 g is naturally dropped from a height of 8 mm in the vertical direction on the energy conversion element, which has been subjected to a heat treatment at 85° C. for 14 days and placed on a horizontal plane at a temperature of 23° C. in an environment of a relative humidity of 50%, is 5 mV or more.

13. The energy conversion element according to claim 7, wherein a maximum voltage, which is generated by an impact when an iron ball having a diameter of 9.5 mm and a mass of 3.5 g is naturally dropped from a height of 8 mm in the vertical direction on the energy conversion element, which has been subjected to a heat treatment at 85° C. for 14 days and placed on a horizontal plane at a temperature of 23° C. in an environment of a relative humidity of 50%, is 5 mV or more.

14. The energy conversion element according to claim 4, wherein a maximum voltage, which is generated by an impact when an iron ball having a diameter of 9.5 mm and a mass of 3.5 g is naturally dropped from a height of 8 mm in the vertical direction on the energy conversion element, which has been subjected to a heat treatment at 85° C. for 14 days and placed on a horizontal plane at a temperature of 23° C. in an environment of a relative humidity of 50%, is 5 mV or more.

15. The energy conversion element according to claim 8, wherein a maximum voltage, which is generated by an impact when an iron ball having a diameter of 9.5 mm and a mass of 3.5 g is naturally dropped from a height of 8 mm in the vertical direction on the energy conversion element, which has been subjected to a heat treatment at 85° C. for 14 days and placed on a horizontal plane at a temperature of 23° C. in an environment of a relative humidity of 50%, is 5 mV or more.

16. The energy conversion element according to claim 9, wherein a maximum voltage, which is generated by an impact when an iron ball having a diameter of 9.5 mm and a mass of 3.5 g is naturally dropped from a height of 8 mm in the vertical direction on the energy conversion element, which has been subjected to a heat treatment at 85° C. for 14 days and placed on a horizontal plane at a temperature of 23° C. in an environment of a relative humidity of 50%, is 5 mV or more.

17. The energy conversion element according to claim 10, wherein a maximum voltage, which is generated by an impact when an iron ball having a diameter of 9.5 mm and a mass of 3.5 g is naturally dropped from a height of 8 mm in the vertical direction on the energy conversion element, which has been subjected to a heat treatment at 85° C. for 14 days and placed on a horizontal plane at a temperature of 23° C. in an environment of a relative humidity of 50%, is 5 mV or more.

* * * * *